(12) United States Patent
Itai

(10) Patent No.: US 8,188,480 B2
(45) Date of Patent: May 29, 2012

(54) THIN FILM FIELD EFFECT TRANSISTOR AND DISPLAY

(75) Inventor: Yuichiro Itai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 143 days.

(21) Appl. No.: 12/397,358

(22) Filed: Mar. 4, 2009

(65) Prior Publication Data

US 2009/0236596 A1    Sep. 24, 2009

(30) Foreign Application Priority Data

Mar. 24, 2008  (JP) ................................. 2008-076493

(51) Int. Cl.
*H01L 29/04* (2006.01)
(52) U.S. Cl. ...... 257/72; 257/66; 257/288; 257/E33.013
(58) Field of Classification Search ............... 257/72, 257/66, 288, E33.013
See application file for complete search history.

(56) References Cited

U.S. PATENT DOCUMENTS

| 6,091,076 A | 7/2000 | Deleonibus |
| 2004/0075123 A1 | 4/2004 | Fraboulet et al. |
| 2005/0039670 A1 | 2/2005 | Hosono et al. |
| 2007/0108446 A1 * | 5/2007 | Akimoto ........................ 257/61 |
| 2008/0197344 A1 * | 8/2008 | Yano et al. ..................... 257/40 |
| 2008/0237598 A1 * | 10/2008 | Nakayama ..................... 257/59 |

FOREIGN PATENT DOCUMENTS

| JP | 2000-124456 | * | 4/2000 |
| JP | 2006-121029 |   | 5/2006 |
| JP | 2006-165529 A |   | 6/2006 |
| JP | 2007-73701 |   | 3/2007 |
| JP | 2007-73704 |   | 3/2007 |
| JP | 2007-123702 |   | 5/2007 |

OTHER PUBLICATIONS

The extended European Search Report dated Jul. 10, 2009.

* cited by examiner

*Primary Examiner* — Zandra Smith
*Assistant Examiner* — Jamie C Niesz
(74) *Attorney, Agent, or Firm* — SOLARIS Intellectual Property Group, PLLC

(57) ABSTRACT

A TFT is provided which includes, on a substrate, at least a gate electrode, a gate insulating layer, an active layer containing an amorphous oxide semiconductor, a source electrode and a drain electrode, wherein a resistance layer containing an amorphous oxide and having a thickness of more than 3 nm is disposed between the active layer and at least one of the source electrode or the drain electrode, and a band gap of the active layer is smaller than a band gap of the resistance layer. Also, a display using the TFT is provided.

16 Claims, 2 Drawing Sheets

THIN FILM FIELD EFFECT TRANSISTOR AND DISPLAY

CROSS-REFERENCE TO RELATED APPLICATION

This application claims priority under 35 USC 119 from Japanese Patent Application No. 2008-76493, the disclosure of which is incorporated by reference herein.

BACKGROUND OF THE INVENTION

1. Field of the Invention

The present invention relates to a thin film field effect transistor and a display using the same. Particularly, it relates to a thin film field effect transistor in which an amorphous oxide semiconductor is used for an active layer, and a display using the same.

2. Description of the Related Art

In recent years, flat panel displays (FPDs) have been put to practical use, due to the progress made in liquid crystal and electroluminescence (EL) technologies, etc. Especially, an organic electroluminescence element (hereinafter referred to as an "organic EL element" in some cases) formed using a thin film material which emits light by excitation due to application of electric current can provide light emission of high brightness at low voltage, and thus is expected to achieve reduction in device thickness, weight, and size, and power saving, etc. in wide ranging applications including mobile phone displays, personal digital assistants (PDA), computer displays, car information displays, TV monitors, and general illumination.

These FPDs are driven by an active matrix circuit including thin film field effect transistors each using, as an active layer, an amorphous silicon thin film or a polycrystalline silicon thin film provided on a glass substrate. (In the description below, the thin film field effect transistor is sometimes referred to as a "thin film transistor" or "TFT".)

On the other hand, to make the FPD thinner, lighter, and more resistant to breakage, attempts are being made to use a resin substrate which is light in weight and flexible instead of the glass substrate.

However, fabrication of the transistors using the silicon thin films described above requires a thermal treatment process at a relatively high temperature, and it is difficult to form the transistors directly on a resin substrate which is generally low in heat resistance.

For example, in Japanese Patent Application Laid-Open (JP-A) No. 2006-121029, a MOSFET (metal-oxide semiconductor field effect transistor) that reduces a driving voltage of a transistor that uses a silicon thin film is disclosed, and a configuration that uses indium tin oxide (ITO), tin oxide, zinc oxide or the like as a semiconductor material of an active layer and uses a dielectric material having a large dielectric constant in a gate insulating layer is disclosed. It is disclosed that ITO, tin oxide, zinc oxide or the like is a crystalline metal oxide and has a carrier concentration of substantially $1 \times 10^{19}$ $cm^{-3}$. In the case of an active layer made of the crystalline metal oxide, in order to obtain desired semiconductor characteristics, after film formation by sputtering, a high temperature heat treatment step such as post-annealing at 300° C. for 15 minutes is necessary in order to control the crystallization. Accordingly, such an active layer is difficult to form directly on a resin substrate that is poor in heat resistance.

JP-A No. 2000-124456 discloses a TFT using a two-layer structure of a channel layer comprising a thin film formed from amorphous silicon or the like and an offset layer comprising a thin silicon carbide film or the like as a liquid crystal screen control TFT. However, while the TFT can be utilized as a liquid crystal screen control TFT using a glass substrate, it is difficult to fabricate the TFT on a flexible resin substrate since the flexible resin substrate intrinsically involves the problem of heat resistance described above.

An amorphous oxide such as an In—Ga—Zn—O-based amorphous oxide can form a film at low temperatures, and, accordingly, has been attracting attention as a material capable of forming a film at room temperature on a plastic film. However, when an amorphous oxide semiconductor is used in an active layer of a TFT, an OFF current is high, and accordingly, there is a problem in that an ON/OFF ratio is low. Further, improvement in stability and reliability such as with respect to occurrence of hysteresis or change in electric characteristics of the TFT over time has been desired.

As means for solving the problems described above, a configuration in which an amorphous oxide insulating film containing In—M—Zn (in which M is at least one element selected from Ga, Al, Fe, Sn, Mg, Ca, Si or Ge) as a main constituent element and having an electric resistance value of $10^{11}$ Ω·cm or more is disposed as a resistance layer between an active layer and a gate insulating layer is disclosed. Further, there is disclosure of using an amorphous oxide semiconductor containing In—M—Zn (in which M is at least one element selected from Ga, Al, Fe, Sn, Mg, Ca, Si, or Ge) as a main constituent element and having an electric resistance value of less than $10^{10}$ Ω·cm as an active layer which constitutes a channel, thereby making the band gap of the amorphous oxide insulating film greater than the band gap of the amorphous oxide semiconductor layer (see, for example, JP-A No. 2007-73701).

It is disclosed that, when a carrier concentration of an amorphous oxide semiconductor is reduced to, for example, less than $10^{18}$ $cm^{-3}$, a TFT operates, that when the carrier concentration is less than $10^{16}$ $cm^{-3}$, a TFT having excellent ON/OFF ratio is obtained, and that, in order to impart more excellent low OFF current characteristics, the carrier concentration is preferably reduced to less than $10^{16}$ $cm^{-3}$. As a method of forming the amorphous oxide semiconductor, there has been disclosed a method of forming an amorphous oxide semiconductor layer by integrating a plurality of oxide layers in which the composition and elements of each of the layers are different from each other, and melting and mixing metal ingredients of the respective layers with each other during the forming process (see, for example, JP-A No. 2007-73704). Further, JP-A No. 2007-123702 discloses using an oxide semiconductor as an active layer formed by integrating an oxide semiconductor as a base material, and an oxide layer-spacer material having oxygen atoms at a film thickness that is less than a film thickness that causes a tunnel effect.

However, in TFTs supplied for practical use, in addition to low OFF current and high ON/OFF ratio, it is required that the characteristics do not vary even under continuous driving, and that stable performance is exhibited even when conditions such as a temperature or humidity in an operating environment vary. That is, there still remain many problems to be overcome.

SUMMARY OF THE INVENTION

The present invention has been made in view of the above circumstances and provides a thin film field effect transistor and a display using the same with the following aspects.

A first aspect of the invention provides a thin film field effect transistor comprising, on a substrate, at least a gate electrode, a gate insulating layer, an active layer containing an amorphous oxide semiconductor, a source electrode and a drain electrode, wherein a resistance layer containing an amorphous oxide and having a thickness of more than 3 nm is disposed between the active layer and at least one of the source electrode or the drain electrode, and a band gap of the active layer is smaller than a band gap of the resistance layer.

A second aspect of the invention provides a display comprising a light-emitting element having a pair of electrodes and a light emission layer interposed between the electrodes, and a field effect transistor for driving the light-emitting element, wherein the field effect transistor is the thin film field effect transistor according to the first aspect.

DETAILED DESCRIPTION OF THE INVENTION

Figure 1:
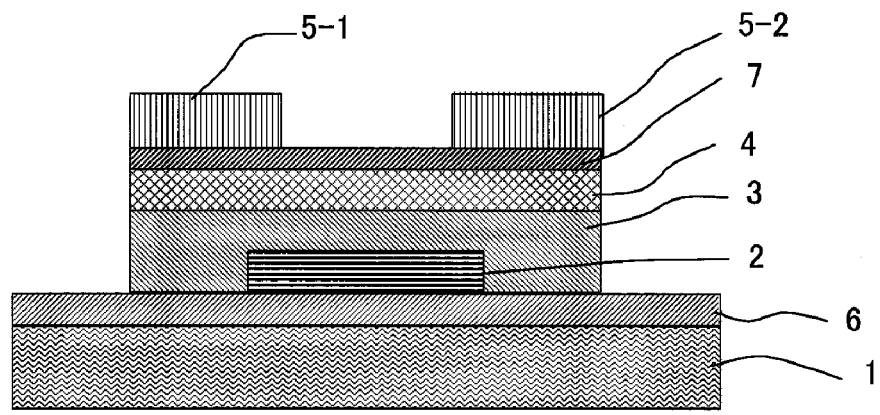
FIG. 1 is a schematic diagram showing the structure of a TFT element according to the invention.

It is an object of the invention to provide a TFT using an amorphous oxide semiconductor, and particularly, to provide an improved TFT which has a low OFF current and a high ON/OFF ratio, and has improved operation stability in which TFT performance does not vary even with a repeated operation thereof. Furthermore, it is an object of the invention to provide a high-performance TFT which can be prepared on a flexible resin substrate. Also, it is another object of the invention to provide a display using the TFT.

The problems of the invention described above have been solved by a thin film field effect transistor including, on a substrate, at least a gate electrode, a gate insulating layer, an active layer containing an amorphous oxide semiconductor, a source electrode and a drain electrode, wherein a resistance layer containing an amorphous oxide and having a thickness of more than 3 nm is disposed between the active layer and at least one of the source electrode or the drain electrode, and a band gap of the active layer is smaller than a band gap of the resistance layer.

Preferably, the band gap of the active layer is 2.0 eV or more and less than 4.0 eV.

Preferably, the band gap of the resistance layer is 4.0 eV or more and less than 15.0 eV.

Preferably, a difference between the band gap of the active layer and the band gap of the resistance layer is 0.1 eV or more and less than 13.0 eV.

Preferably, a carrier concentration of the active layer is higher than a carrier concentration of the resistance layer.

Preferably, a film thickness of the resistance layer is from 5 nm to 80 nm.

Preferably, the amorphous oxide semiconductor in the active layer includes at least one element selected from In, Sn, Zn, or Cd.

Preferably, the amorphous oxide in the resistance layer includes at least one element selected from Ga, Mg, Al, Ca, or Si.

Preferably, two layers comprising the active layer and the resistance layer are disposed between the gate insulating layer, and the source electrode or the drain electrode.

Preferably, the active layer and the resistance layer are layers each formed by a sputtering method.

Preferably, the substrate is a flexible substrate.

Another problem of the invention described above has been solved by a display including a light-emitting element having a pair of electrodes and a light emission layer interposed between the electrodes, and a field effect transistor for driving the light-emitting element, wherein the field effect transistor is a thin film field effect transistor comprising, on a substrate, at least a gate electrode, a gate insulating layer, an active layer containing an amorphous oxide semiconductor, a source electrode and a drain electrode, wherein a resistance layer containing an amorphous oxide and having a thickness of more than 3 nm is disposed between the active layer and at least one of the source electrode or the drain electrode, and a band gap of the active layer is smaller than a band gap of the resistance layer.

A TFT using an amorphous oxide semiconductor has been attracting attention as a material for an active layer of a film (flexible) TFT, because an amorphous oxide semiconductor film can be formed at room temperature, which allows a TFT to be prepared using a flexible plastic film as a substrate. Particularly, as disclosed in JP-A No. 2006-186319, it is reported that a TFT which is formed on a PET film and has good performance such as a field effect mobility of 10 cm$^2$/Vs and an ON/OFF ratio of over $10^3$ was achieved by using an amorphous oxide semiconductor having a carrier concentration of less than $10^{18}$ cm$^{-3}$ in an active layer.

However, when such a TFT is used in a drive circuit of a display, the performance of the TFT is still insufficient with regard to mobility and ON/OFF ratio to operate the drive circuit. An amorphous oxide semiconductor used for the active layer tends to have low electron mobility when the carrier concentration is decreased, so that it has been difficult to form a TFT which can achieve both of good OFF characteristics and high mobility at the same time.

Furthermore, as a result of detailed analysis by the present inventors, new problems have been found such that, when the carrier concentration is reduced to less than $10^{18}$ cm$^{-3}$, the operation stability of the TFT becomes poor, the OFF current value varies, and a threshold voltage of the TFT varies. The lower the carrier concentration is, the larger the variation of the OFF current value and the variation of the threshold voltage of the TFT are. It has been found that, in particular, when the carrier concentration is reduced to less than $3\times10^{17}$ cm$^{-3}$, variation that presents an obstacle to practical use is caused. It has been found that the variation of the OFF current value and the variation of the threshold voltage of the TFT are also generated when the TFT is continuously and repeatedly driven. Conventionally, when such a problem is caused in a semiconductor element, it has been common to introduce, as a countermeasure, a temperature compensation circuit unit. However, there are adverse effects such that the circuit becomes complicated and an element volume becomes larger to result in a decrease in aperture ratio. Accordingly, this problem is an important problem to be solved; that is, in addition to attaining both of good OFF current characteristics and high mobility, improvement in operation stability and durability is demanded.

The inventors, after earnestly conducting development and research, have found that the problem is overcome utterly unexpectedly by a thin film field effect transistor including, on a substrate, at least a gate electrode, a gate insulating layer, an active layer containing an amorphous oxide semiconductor, a source electrode and a drain electrode, wherein a resistance layer containing an amorphous oxide and having a thickness of more than 3 nm is disposed between the active layer and at least one of the source electrode or the drain electrode, and a band gap of the active layer is smaller than a band gap of the resistance layer, whereby the invention was achieved.

According to the present invention, a TFT is provided which has a low OFF current and a high ON/OFF ratio, and is excellent in operation stability for continuous driving. Particularly, a TFT which is useful as a film (flexible) TFT using a flexible substrate is provided. In the constitution of the active layer and resistance layer in the invention, the active layer is protected by the resistance layer, and therefore, a resistance to chemical processing is increased, and durability with respect to an etching solution during patterning or the like is improved. Also, a display using the TFT is provided.

1. Thin Film Field Effect Transistor (TFT)

The thin film field effect transistor of the invention is an active element which has at least a gate electrode, a gate insulating layer, an active layer, a source electrode and a drain electrode in this order, and has a function of switching current between the source electrode and the drain electrode, in which the current passing through the active layer is controlled by applying voltage to the gate electrode. As the TFT structure, either of a stagger structure or a reversed stagger structure may be formed.

TFT of the invention has an active layer containing an amorphous oxide semiconductor and a resistance layer containing an amorphous oxide and having a thickness of more than 3 nm disposed between the active layer and at least one of a source electrode or a drain electrode, wherein a band gap of the active layer is smaller than a band gap of the resistance layer. According to the constitution of the invention, excellent ON/OFF characteristics can be obtained even when the active layer containing an amorphous oxide semiconductor has a high carrier density of $1 \times 10^{15}$ cm$^{-3}$ or more.

The band gap in the invention is defined as an energy difference between a valence band which is the highest energy band filled with electrons and a conduction band which is the lowest energy band with no electrons, and is a value determined by an optical method (light absorption spectrum). The light absorption spectrum is measured by attaching an integration sphere to a visible to UV spectrophotometer, and measuring a diffuse reflection spectrum. Upon irradiation of light having an energy higher than the band gap, as the light is absorbed, the energy of the light at an absorption spectrum edge where absorption begins is measured as a band gap.

Preferably, only two layers of the active layer and the resistance layer are substantially present between the gate insulating layer and the source electrode or the drain electrode.

Preferably, the active layer containing the amorphous oxide semiconductor is disposed adjacent to the gate insulating layer, and the resistance layer is disposed adjacent to at least one of the source electrode or the drain electrode. Conventionally, a layer containing an amorphous oxide involves a problem tending to be corroded easily by a chemical etching solution, and thereby, it is difficult to utilize a chemical etching method for patterning the layer disposed thereon. Since the resistance layer laminated according to the invention has an advantage of excellent acid resistance, the constitution of the layer arrangement enables pattering of the source electrode and the drain electrode by chemical etching, to provide an effect of improving TFT productivity.

Preferably, the band gap of the active layer is 2.0 eV or more and less than 4.0 eV, and the band gap of the resistance layer is 4.0 eV or more and less than 15.0 eV. The difference ($\Delta$E) between the band gap of the resistance layer (E$_2$) and the band gap of the active layer (E$_1$) is preferably 0.1 eV or more and less than 13.0 eV, and more preferably from 0.5 eV to 2.0 eV.

When E$_1$ is less than 2.0 eV, most of visible lights is absorbed and excited to the conduction band, to result in a problem of tending to cause erroneous operation in a case of using a visible light emission body as a display part. When E$_1$ is 4.0 eV or more, the gap is excessively large and, even when carriers are injected, they form a stable energy level between the gaps, to result in a problem that the layer less functions as the active layer, which is not preferable.

When E$_2$ is less than 4.0 eV, the resistance layer functions as the active layer, which is not preferred. Further, it is not practical to obtain a substance capable of satisfying the condition of 15.0 eV or more.

When $\Delta$E is less than 0.1 eV, since the difference between the band gap of the active layer and the band gap of the resistance layer is excessively small, there is not difference in view of the operation as a device and the effect of the invention cannot be obtained. Further, when $\Delta$E is 13.0 eV or more, since the difference between the band gap of the active layer and the band gap of the resistance layer is excessively large, barriers for electrons to movement from the source electrode to the active layer or from the active layer to the drain electrode are often increased excessively, and ON current decreases, which is not preferable.

Preferably, a carrier concentration of the active layer is higher than a carrier concentration of the resistance layer.

Preferably, the amorphous oxide semiconductor in the active layer includes at least one element selected from the group consisting of In, Sn, Zn, and Cd.

Preferably, the amorphous oxide in the resistance layer includes at least one element selected from the group consisting of Ga, Mg, Al, Ca, and Si.

Preferably, the active layer and the resistance layer are layers each formed by a sputtering method.

Preferably, the substrate is a flexible substrate.

The TFT of the invention is to be described in the following in more detail.

1) Active Layer

Since the amorphous oxide semiconductor used for the active layer in the invention can be formed into a film at low temperature, it can be fabricated on a flexible resin substrate such as of plastics.

The amorphous oxide semiconductor used for the active layer in the invention is preferably an oxide containing In, Sn, Zn or Cd, more preferably, an oxide containing In, Sn, or Zn, and even more preferably an oxide containing In or Zn. The electric conductivity of the active layer in the invention is not particularly limited, but the electric conductivity is preferably from $10^{-10}$ S/cm to $10^{+1}$ S/cm, and more preferably from $10^{-7}$ S/cm to $10^{-3}$ S/cm.

Specific examples of the amorphous oxide semiconductor used for the active layer in the invention include $In_2O_3$, ZnO, $SnO_2$, CdO, Indium-Zinc-Oxide (IZO), Indium-Tin-Oxide (ITO), Gallium-Zinc-Oxide (GZO), Indium-Gallium-Oxide (IGO), and Indium-Gallium-Zinc-Oxide (IGZO).

<Band Gap>

The band gap of the active layer of the invention is 2.0 eV or more and less than 4.0 eV, preferably from 2.2 eV to 3.8 eV, and more preferably from 3.0 eV to 3.5 eV.

The band gap of the active layer in the invention is prepared (controlled) as described below. For example, Indium-Gallium-Zinc-Oxide (IGZO) can be prepared by co-sputtering of (2.5 eV), ZnO (3.3 eV) and $Ga_2O_3$ (4.6 eV). When the ratio of $Ga_2O_3$ of larger band gap (4.6 eV) increases, the band gap of the active layer increases correspondingly and, when the ratio of $In_2O_3$ (2.5 eV) increases, the band gap of the active layer decreases correspondingly.

<Carrier Concentration>

The carrier concentration of the active layer in the invention can be controlled to a desired value by various means.

The carrier concentration of the active layer in the invention is not particularly limited, but is preferably in a high region of $1\times10^{15}$ $cm^{-3}$ or more, and more preferably from $1\times10^{15}$ $cm^{-3}$ to $1\times10^{21}$ $cm^{-3}$.

As the means for adjusting the carrier concentration of the active layer, the following means are described.

(1) Adjustment by Oxygen Defect

It is known that when an oxygen vacancy is made in an oxide semiconductor, a carrier concentration of an active layer is increased, which results in an increase in electric conductivity. Hence, the carrier concentration of an oxide semiconductor can be controlled by adjusting the quantity of oxygen vacancies. Specifically, methods for controlling the quantity of oxygen vacancies include adjusting the partial pressure of oxygen during film formation, and oxygen concentration and treatment time of an after-treatment after the film formation. Specifically, examples of the after-treatment include heat treatment at a temperature of 100° C. or higher, processing by oxygen plasma, and UV ozone treatment. Among these, the method involving controlling the partial pressure of oxygen during film formation is preferable in view of its productivity. The carrier concentration of an oxide semiconductor can be controlled by adjusting the partial pressure of oxygen during film formation.

(2) Adjustment by Composition Ratio

It has been known that the carrier concentration can be changed by changing the composition ratio of metals of an oxide semiconductor. For instance, in the case of $InGa Zn_{1-x}Mg_xO_4$, the carrier concentration lowers with an increase in the percentage of Mg. In addition, it has been reported that the carrier concentration of oxides of $(In_2O_3)_{1-x}(ZnO)_x$ lowers with an increase in the percentage of Zn when the Zn/In ratio is 10% or higher.

Specifically, methods for changing the composition ratio, for example in the case of a method of forming a film by sputtering, include a method using targets with different composition ratios. Alternatively, multiple targets may be co-sputtered, changing the composition ratio of the resultant film by individually adjusting the sputtering rates for the targets.

(3) Adjustment by Impurities

When elements such as La, Na, Mn, Ni, Pd, Cu, Cd, C, N, and P are selectively added to an oxide semiconductor as an impurity, the carrier concentration can be reduced. Methods for adding an impurity include co-vapor deposition of the oxide semiconductor and the impurity, and ion-doping of an oxide semiconductor film which has already been formed with ions of the impurity element.

(4) Adjustment by Oxide Semiconductor Material

While in the above (1) to (3), the methods of adjusting the carrier concentration of the same oxide semiconductor system have been described, the carrier concentration can be changed by changing the oxide semiconductor material. It is known that the carrier concentration of $SnO_2$-based oxide semiconductors is lower than the carrier concentration of $In_2O_3$-based oxide semiconductors. In this way, the carrier concentration can be adjusted by changing the oxide semiconductor material.

As the means for adjusting the carrier concentration, the methods stated in the above (1) to (4) may be used independently or in combination.

<Method of Forming Active Layer>

As the methods for forming a film of the active layer, it is suitable to adopt a vapor-phase film forming method using, as a target, a polycrystalline sintered body of an oxide semiconductor. Among the vapor-phase film forming methods, sputtering method and pulsed laser deposition method (PLD method) are adequate. For mass production, sputtering method is preferable.

For instance, by an RF magnetron sputtering deposition method, a film can be formed while controlling the vacuum level and flow rate of oxygen. The higher the flow rate of oxygen is, the lower the electric conductivity can be made.

It can be verified by a conventional X-ray diffraction method that the resultant film is an amorphous film. The composition ratio can be determined by RBS analysis (Rutherford Backscattering Spectrometry).

<Thickness of Active Layer>

The thickness of the active layer is preferably from 0.1 nm to 100 nm, more preferably from 0.5 nm to 50 nm, and even more preferably from 1 nm to 20 nm.

The thickness of the active layer can be determined by HRTEM (High Resolution Transmittance Electron Micrograph) photograph of a section of the prepared element.

2) Resistance Layer

The band gap of the resistance layer used in the present invention is 4.0 eV or more and less than 15.0 eV.

Preferably, the resistance layer contains an oxide containing at least one element selected from the group consisting of Ga, Mg, Al, Ca, and Si, more preferably an oxide containing Ga, Mg, Al, or Ca, and even more preferably an oxide containing Ga, Mg, or Al.

Specifically, the amorphous oxide used in the resistance layer in the present invention is $Ga_2O_3$, MgO, $Al_2O_3$, or an oxide formed by mixing two or more of these oxides.

<Band Gap>

The band gap of the resistance layer in the present invention is 4.0 eV or more and less than 15.0 eV, preferably from 4.2 eV to 12.0 eV, and more preferably from 4.5 eV to 10.0 eV.

The band gap of the resistance layer is preferably prepared (controlled) as described below.

For example, in a mixture of two of $Ga_2O_3$ (4.6 eV) and MgO (8.0 eV), the band gap decreases as the Ga ratio is higher, and the band gap increases as the Mg ratio is higher.

The carrier concentration of the resistance layer in the invention is not particularly limited, and is preferably $10^{12}$ $cm^{-3}$ or less, and more preferably from $10^4$ $cm^{-3}$ to $10^{10}$ $cm^{-3}$.

The electric conductivity of the resistance layer in the present invention is preferably from $10^{-10}$ Scm to $10^{+1}$ Scm, and more preferably from $10^{-7}$ Scm to $10^{-3}$ Scm. The electric resistance can be controlled by a similar means to that described for the control means of the band gap.

The resistance layer in the invention is disposed adjacent to at least one of the gate electrode or the source electrode.

The thickness of the resistance layer is preferably from 3 nm to 100 nm, more preferably from 5 nm to 80 nm, and even more preferably from 10 nm to 50 nm.

3) Gate Electrode

According to the invention, the following materials are among those which are preferable for the gate electrode: a metal such as Al, Mo, Cr, Ta, Ti, Au or Ag, an alloy such as Al—Nd or APC; a metal oxide electrically conductive film of e.g., tin oxide, zinc oxide, indium oxide, indium-tin oxide (ITO), or indium-zinc oxide (IZO); an organic electrically conductive compound such as polyaniline, polythiophene, or polypyrrole; and a mixture thereof.

The thickness of the gate electrode is preferably from 10 nm to 1000 nm, more preferably from 20 nm to 500 nm, and even more preferably from 40 nm to 100 nm.

The method of forming the gate electrode is not particularly limited. The gate electrode can be formed on the substrate according to a method which is appropriately selected from among wet methods such as a printing method and a coating method, physical methods such as a vacuum deposition method, a sputtering method and an ion plating method, chemical methods such as a chemical vapor deposition (CVD) and plasma CVD method, and the like in consideration of the suitability to the material described above. For example, when ITO is selected, the gate electrode can be formed according to a direct current (DC) or high-frequency sputtering method, a vacuum deposition method, or an ion plating method. Further, in the case where an organic electrically conductive compound is selected as the material of the gate electrode, the film formation of the gate electrode can be performed according to a wet film-forming method.

4) Gate Insulating Layer

For the gate insulating layer, an insulator such as $SiO_2$, $SiN_x$, $SiON$, $Al_2O_3$, $Y_2O_3$, $Ta_2O_5$, $HfO_2$ or the like, or a mixed crystal compound containing two or more of them is used. Also, a polymeric insulator such as polyimide may be used for the gate insulating layer.

The thickness of the gate insulating layer is preferably from 10 nm to 1000 nm, more preferably from 50 nm to 500 nm, and even more preferably from 100 nm to 300 nm. To reduce the leak current and raise the voltage resistance, it is required to make the gate insulating layer thicker to a certain extent. However, an increase in the thickness of the gate insulating layer results in a rise in the voltage needed for driving the TFT. Therefore, it is preferable that the thickness of the gate insulating layer is from 50 nm to 1000 nm for an inorganic insulator, and from 0.5 μm to 5 μm for a polymeric insulator.

Especially, it is particularly preferable to use an insulator with a high dielectric constant, such as $HfO_2$, for the gate insulating layer, because then the TFT can be driven with low voltage even when it is made thicker.

5) Source Electrode and Drain Electrode

According to the invention, the following are suitable for the material of the source electrode and the drain electrode: metals such as Al, Mo, Cr, Ta, Ti, Au and Ag; alloys such as Al—Nd and APC; metal oxide electrically conductive films of, for example, tin oxide, zinc oxide, indium oxide, indium-tin oxide (ITO) and indium-zinc oxide (IZO); organic electrically conductive compounds such as polyaniline, polythiophene and polypyrrole; and mixtures thereof.

The thickness of the source electrode and the thickness of drain electrode are each preferably from 10 nm to 1000 nm, more preferably from 20 nm to 500 nm, and even more preferably from 40 nm to 400 nm.

The method of forming the source electrode and the drain electrode is not particularly limited. The electrodes can be formed on the substrate according to a method which is appropriately selected from among wet methods such as a printing method and a coating method, physical methods such as a vacuum deposition method, a sputtering method and an ion plating method, chemical methods such as a CVD and plasma CVD method, and the like in consideration of the suitability to the material described above. For example, when ITO is selected, the electrodes can be formed according to a DC or high-frequency sputtering method, a vacuum deposition method, an ion plating method, etc. Further, in the case where an organic electrically conductive compound is selected as the material of the source electrode and the drain electrode, the film formation of the source electrode and drain electrode can be performed according to a wet film-forming method.

6) Substrate

According to the invention, the substrate used herein is not particularly limited. The following materials are for example suitable for the substrate: inorganic materials such as YSZ (zirconia stabilized yttrium) and glass; and organic materials including polyesters such as polyethylene terephthalate, polybutylene terephthalate and polyethylene naphthalate, and synthetic resins such as polystyrene, polycarbonate, polyether sulfone, polyarylate, allyl diglycol carbonate, polyimide, polycycloolefin, norbornene resin, and polychlorotrifluoroethylene. In the case of the organic materials described above, a material superior in heat resistance, stability of dimension, resistance to solvents, electric insulating property, workability, low gas permeability, low hygroscopicity, and the like is preferable for the substrate.

According to the invention, it is particularly preferable to use a flexible substrate. As the material used for the flexible substrate, an organic plastic film which has high transmittance is preferable. For instance, the following materials can be used: polyesters such as polyethylene terephthalate, polybutylene phthalate and polyethylene naphthalate; and plastic films such as of polystyrene, polycarbonate, polyether sulfone, polyarylate, polyimide, polycycloolefin, norbornene resin, or polychlorotrifluoroethylene. Also, it is preferable that such film-shaped plastic substrate has an insulating layer in the case where the insulation is insufficient, a gas-barrier layer for preventing moisture and oxygen from penetrating through the substrate, or an undercoat layer for enhancing planarity and adhesion of the film-shaped plastic substrate with the electrode or active layer.

It is preferable that the thickness of the flexible substrate is from 50 μm to 500 μm.

The reason for this is that when the thickness of the flexible substrate is less than 50 μm, it is hard for the substrate to maintain sufficient planarity itself, and when the flexible substrate is thicker than 500 μm, it becomes difficult to bend the substrate itself freely, i.e., the flexibility of the substrate becomes insufficient.

7) Structure

Next, the structure of TFT in the invention is to be described specifically with reference to the drawings.

FIG. 1 is a schematic diagram showing an example of the structure of the TFT according to the invention. In the case where a substrate 1 is a flexible substrate such as a plastic film, an insulating layer 6 is disposed on at least one surface of the substrate 1, on which a gate electrode 2, a gate insulating layer 3, an active layer 4 containing an amorphous oxide semiconductor, and a resistance layer 7 are stacked, and on the surface of the structure thus constructed, a source electrode 5-1 and a drain electrode 5-2 are disposed.

Figure 2:
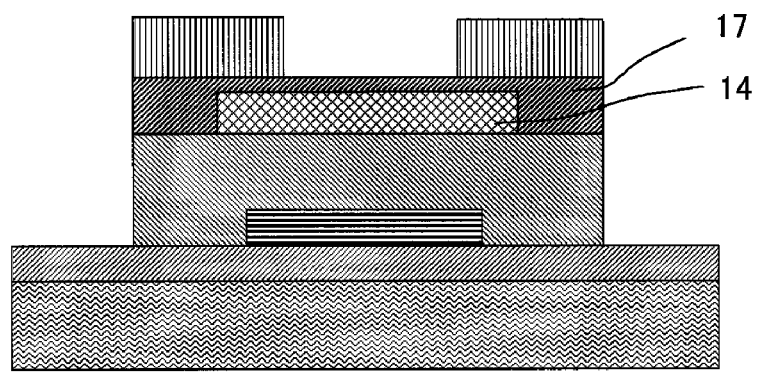
FIG. 2 is a schematic diagram showing the structure of a TFT element according to another embodiment of the invention.

FIG. 2 is a schematic diagram showing another example of the structure of the TFT according to the invention. An active layer 14 is disposed adjacent to a gate insulating layer, and a resistance layer 17 is disposed so as to cover the active layer 14, and on the surface of the resistance layer 17, a source electrode 5-1 and a drain electrode 5-2 are disposed. According to the constitution, since the active layer 14 containing the amorphous oxide semiconductor is protected by the resistance layer 17 which has excellent chemical resistance, the source electrode 5-1 and the drain electrode 5-2 can be patterned easily by a chemical etching method. For example, after uniformly forming the source electrode 5-1 and the drain electrode 5-2 by vapor deposition on the resistance layer 17, a photo resist film that is well known is coated, and after forming a pattern, the source electrode 5-1 or the drain electrode 5-2 can be patterned by treatment with an acidic etching solution.

Figure 3:
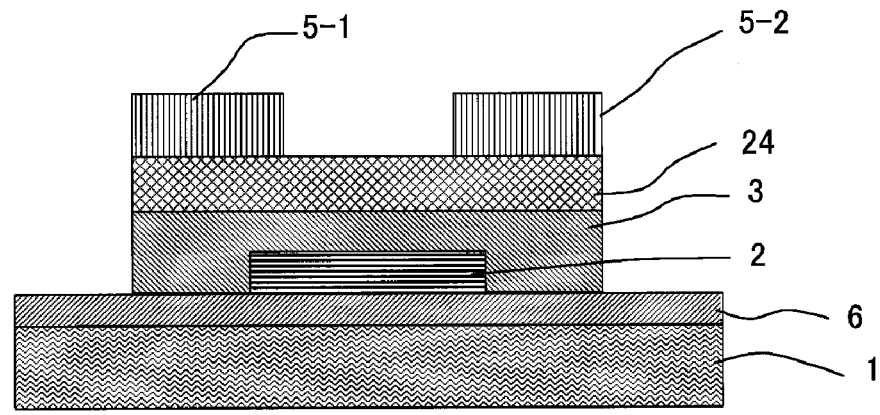
FIG. 3 is a schematic diagram showing the structure of a conventional TFT element.

FIG. 3 is a schematic diagram showing an example of the structure of a conventional TFT. In the case where the substrate 1 is a flexible substrate such as a plastic film, an insulating layer 6 is disposed on at least one surface of the substrate 1, on which a gate electrode 2, a gate insulating layer 3 and an active layer 24 are stacked, and on the surface of the structure thus constructed, a source electrode 5-1 and a drain electrode 5-2 are disposed. In the case where the active layer 24 is an amorphous oxide layer, since the amorphous oxide has no resistance to the chemical etching solution, a resist method cannot be utilized for disposing the source electrode 5-1 or the drain electrode 5-2, and therefore, it is necessary to overlay a shadow mask sheet on the active layer 24 to shield a portion not forming the source electrode 5-1 or the drain electrode 5-2, and thereafter, vapor deposition of the source electrode 5-1 or the drain electrode 5-2 is conducted. Therefore, high definition patterning by the means is difficult.

Figure 4:
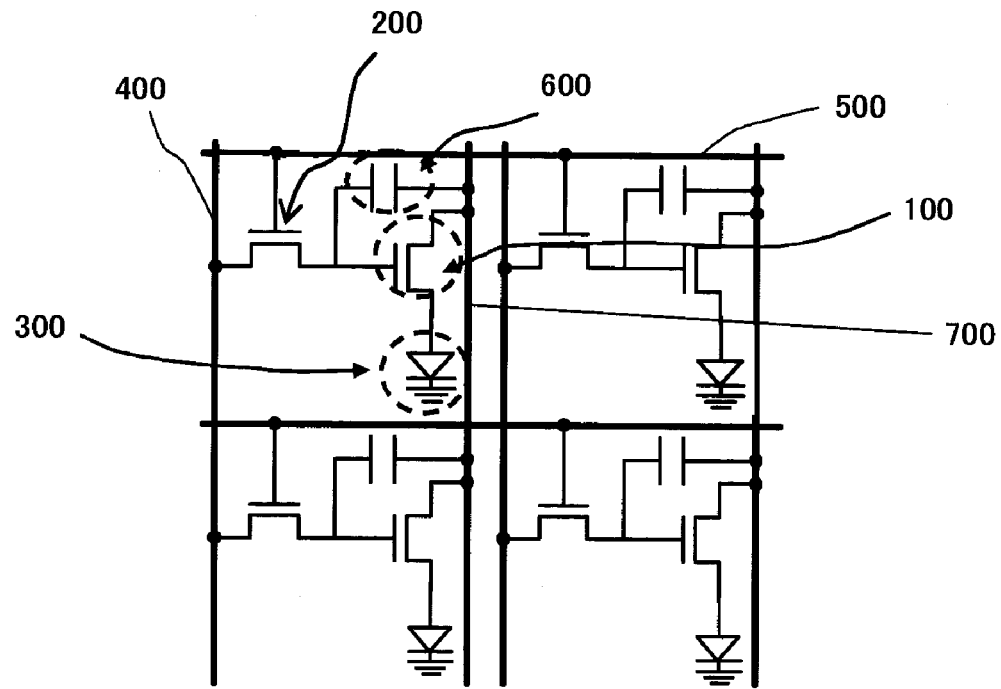
FIG. 4 is a schematic diagram of an equivalent circuit of an active matrix-driving type organic EL display using the TFT element according to the invention.
Figure 5:
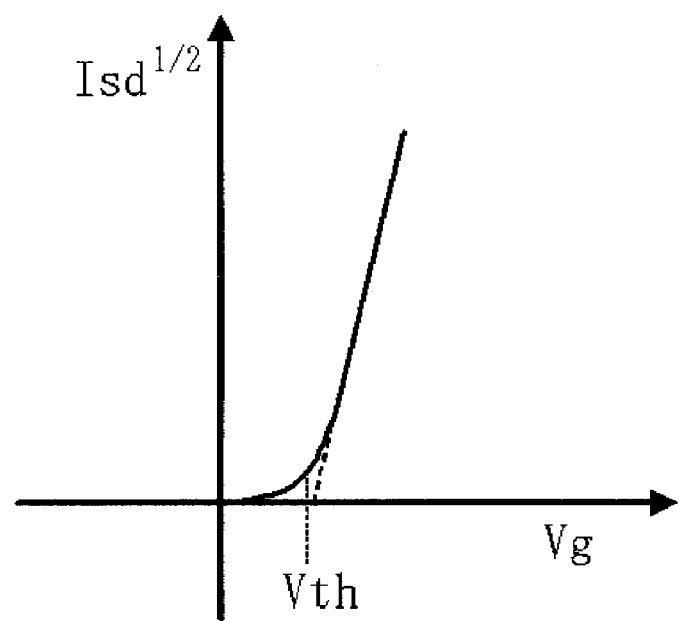
FIG. 5 is a schematic view of a graph showing how to determine a threshold voltage (Vth) of a TFT in the evaluation of performance. The horizontal axis represents a gate voltage (Vg), and the vertical axis represents ½ square of Isd (current between a source electrode and a drain electrode) ($Isd^{1/2}$).

FIG. 4 is a schematic diagram of an equivalent circuit of an active matrix type organic EL display which uses the TFT of the invention. In FIG. 4, an organic EL element 300, a driver TFT 100, a switching TFT 200, and a capacitor 600 are wired with a scanning wire 500, signal wire 400, and common wire 700. The circuit of the display according to the invention is not particularly limited to that shown in FIG. 4. A circuit which is conventionally known in the art may be applied as-is.

2. Display

The thin film field effect transistor of the invention is preferably used for an image display with a liquid crystal or EL element incorporated therein, and particularly for a flat panel display (FPD). More preferably, it is used for a flexible display in which a flexible substrate such as an organic plastic film is used as its substrate. Particularly, the thin film field effect transistor of the invention has high mobility, and therefore it is most preferably used for a display incorporating an organic EL element, a flexible organic EL display.

(Organic EL Display)

The organic EL display of the invention includes, on a substrate, an organic EL element having at least a lower electrode, an organic compound layer containing at least a light-emitting layer and an upper electrode, in this order, and a TFT for driving the organic EL element having at least a gate electrode, a gate insulating layer, an active layer containing an oxide semiconductor, a source electrode, and a drain electrode on the upper electrode. Since the TFT is disposed at a back side of the organic EL element, an aperture for extracting light emitted from the organic EL element can be made larger. Preferably, a protective insulating layer is disposed between the TFT and the organic EL element, and the upper electrode of the organic EL element and the source electrode or the drain electrode of the TFT are electrically connected by way of a contact hole formed in the protective insulating layer. Preferably, the lower electrode is a light transmitting electrode and the upper electrode is a light reflective electrode.

Hereinafter, the organic EL element according to the invention is described in detail.

The light-emitting element according to the invention has a cathode and an anode on a substrate, and an organic compound layer containing an organic light-emitting layer (hereinafter, sometimes simply referred to as a "light-emitting layer") between the two electrodes. Due to the nature of a light-emitting element, it is preferred that at least one electrode of the anode or the cathode is transparent.

As an integration pattern of the organic compound layer according to the present invention, it is preferred that the layer includes a hole transport layer, a light-emitting layer, and an electron transport layer integrated in this order from the anode side. Moreover, a hole injection layer is provided between the hole transport layer and the anode, and/or an electron transporting intermediate layer is provided between the light-emitting layer and the electron transport layer.

In addition, a hole transporting intermediate layer may be provided between the light-emitting layer and the hole transport layer, and similarly, an electron injection layer may be provided between the cathode and the electron transport layer.

Further, each of the layers may be composed of plural secondary layers.

The respective layers constituting the organic compound layer can be suitably formed in accordance with any of a dry film-forming method such as a vapor deposition method, or a sputtering method; a transfer method; a printing method; a coating method; an ink-jet method; a spray method; or the like.

Next, the components constituting the organic EL element according to the present invention will be described in detail.

(Substrate)

The substrate to be applied in the invention is preferably one which does not scatter or attenuate light emitted from the organic compound layer. Specific examples of materials for the substrate include inorganic materials such as zirconia-stabilized yttrium (YSZ), glass and the like; organic materials such as polyesters, for example, polyethylene terephthalate, polybutylene phthalate, and polyethylene naphthalate, polystyrene, polycarbonate, polyethersulfone, polyarylate, polyimide, polycycloolefin, norbornene resin, polychlorotrifluoroethylene, and the like.

For instance, when glass is used as the substrate, non-alkali glass is preferably used with respect to the quality of material in order to decrease ions eluted from the glass. In the case of employing soda-lime glass, it is preferred to use glass on which a barrier coat of silica or the like has been applied. In the case of employing an organic material, it is preferred to use a material excellent in heat resistance, dimensional stability, solvent resistance, electric insulating property, and workability.

There is no particular limitation as to the shape, the structure, the size or the like of the substrate, but it may be suitably selected according to the application, purpose and the like of the light-emitting element. In general, a plate-like substrate is preferred as the shape of the substrate. A structure of the substrate may be a monolayer structure or a laminate structure. Furthermore, the substrate may be formed from a single member or two or more members.

Although the substrate may be transparent and colorless, or transparent and colored, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hardcoat layer or an undercoat layer may be further provided as needed.

(Anode)

The anode may generally be any material as long as it has a function as an electrode for supplying holes to the organic compound layer, and there is no particular limitation as to the shape, the structure, the size or the like. However, it may be suitably selected from among well-known electrode materials according to the application and purpose of the light-emitting element. As mentioned above, the anode is usually provided as a transparent anode.

Materials for the anode preferably include, for example, metals, alloys, metal oxides, electrically conductive compounds, and mixtures thereof. Specific examples of the anode materials include electrically conductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electrically conductive metal oxides; inorganic electrically conductive materials such as copper iodide and copper sulfide; organic electrically conductive materials such as polyaniline, polythiophene, and polypyrrole; and laminates of these inorganic or organic electrically conductive materials with ITO. Among these, electrically conductive metal oxides are preferred, and particularly, ITO is preferable in view of productivity, high electric conductivity, transparency and the like.

The anode may be formed on the substrate in accordance with a method which is appropriately selected from among wet methods such as a printing method, a coating method and the like; physical methods such as a vacuum deposition method, a sputtering method, an ion plating method and the like; and chemical methods such as a CVD and plasma CVD method and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence element according to the present invention, a position at which the anode is to be formed is not particularly limited, and it may be suitably selected according to the application and purpose of the light-emitting element. However, the anode is preferably formed on the substrate. In this case, the anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in a range of from 10 nm to 50 μm, and preferably from 50 nm to 20 μm.

A value of electric resistance of the anode is preferably $10^3 \Omega/\square$ or less, and more preferably $10^2 \Omega/\square$ or less.

In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTEN-KAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming a film thereof at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the light-emitting element.

Materials constituting the cathode include, for example, metals, alloys, metal oxides, electrically conductive compounds, and mixtures thereof. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by weight to 10% by weight of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, the contents of which are incorporated by reference herein.

A method for forming the cathode is not particularly limited, but it may be formed in accordance with a well-known method.

For instance, the cathode may be formed in accordance with a method which is appropriately selected from among wet methods such as a printing method, a coating method and the like; physical methods such as a vacuum deposition method, a sputtering method, an ion plating method and the like; and chemical methods such as a CVD and plasma CVD method and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted between the cathode and the organic compound layer with a thickness of from 0.1 nm to 5 nm. The insulating layer may be considered to be a kind of electron injection layer. The dielectric material layer may be formed in accordance with, for example, a vacuum deposition method, a sputtering method, an ion-plating method or the like.

A thickness of the cathode may be suitably selected according to materials for constituting the cathode and is therefore not definitely decided, but it is usually in a range of from 10 nm to 5 μm, and preferably from 50 nm to 1 μm.

Moreover, the cathode may be transparent or opaque. The transparent cathode may be formed by preparing a material for the cathode with a small thickness of 1 nm to 10 nm, and further laminating a transparent electrically conductive material such as ITO or IZO thereon.

(Organic Compound Layer)

The organic compound layer according to the present invention is to be described.

The organic EL element according to the present invention has at least one organic compound layer including a light-emitting layer. An organic compound layer apart from the light-emitting layer comprises a hole transport layer, an electron transport layer, an electric charge blocking layer, a hole injection layer, an electron injection layer and the like as described above.

In the organic EL element according to the present invention, the respective layers constituting the organic compound layer can be suitably formed in accordance with any of a dry film-forming method such as a vapor deposition method or a sputtering method; a wet film-forming method; a transfer method; a printing method; an ink-jet method; or the like.

(Light-Emitting Layer)

The organic light-emitting layer is a layer having functions of receiving holes from the anode, the hole injection layer, or the hole transport layer, and receiving electrons from the cathode, the electron injection layer, or the electron transport layer, and providing a field for recombination of the holes with the electrons to emit light, when an electric field is applied to the layer.

The light-emitting layer according to the present invention may contain only a light-emitting material, or may be a mixture layer containing a light-emitting dopant and a host material. The light-emitting dopant may be a fluorescent light-emitting material or a phosphorescent light-emitting material, and may be a plurality of compounds. Preferably, the host material is an electric charge-transporting material. The host material may be one or a plurality of compounds. For example, a mixture of a hole-transporting host material and an electron transporting host material is preferable. Further, a material, which does not emit light nor transport any electric charge, may be contained in the light-emitting layer.

The light-emitting layer may be a single layer or a plurality of layers, wherein the respective layers may emit light of different color from one another.

In the present invention, any of a fluorescent light-emitting material and a phosphorescent light-emitting material may be used as a light-emitting dopant.

The light-emitting layer according to the present invention may contain two or more types of light-emitting dopants for improving color purity and expanding the wavelength region of emitted light. It is preferred that the light-emitting dopant in the present invention is the dopant satisfying a relationship between the above-described host material and the light-emitting dopant of 1.2 eV> the difference of Ip between host material and light-emitting dopant (ΔIp)>0.2 eV and/or 1.2 eV> the difference of Ea between host material and light-emitting dopant (ΔEa)>0.2 eV in view of drive durability.

<<Phosphorescent Light-Emitting Dopant>>

Examples of the phosphorescent light-emitting dopants generally include complexes containing a transition metal atom or a lanthanoid atom.

For instance, although the transition metal atom is not limited, it is preferably ruthenium, rhodium, palladium, tungsten, rhenium, osmium, iridium, gold, silver, copper or platinum; more preferably rhenium, iridium, or platinum, and even more preferably iridium or platinum.

Examples of the lanthanoid atom include lanthanum, cerium, praseodymium, neodymium, samarium, europium, gadolinium, terbium, dysprosium, holmium, erbium, thulium, ytterbium, and lutetium, and among these lanthanoid atoms, neodymium, europium, and gadolinium are preferred.

Examples of ligands in the complex include the ligands described, for example, in "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "YUHKI KINZOKU KAGAKU—KISO TO OUYOU— (Organometallic Chemistry—Fundamental and Application—)" authored by Akio Yamamoto, published by Shokabo Publishing Co., Ltd. in 1982.

Specific examples of the ligand preferably include halogen ligand (preferably, chlorine ligand), aliphatic carbocyclic ligand (for example, having preferably 5 to 30 carbon atoms, more preferably 6 to 30 carbon atoms, further preferably 6 to 20 carbon atoms, and particularly preferably 6 to 12 carbon atoms, such as cyclopentadienyl anion, benzene anion, naphthyl anion, or the like), nitrogen-containing heterocyclic ligand (for example, having preferably 5 to 30 atoms, more preferably 6 to 30 carbon atoms, further preferably 6 to 20 carbon atoms, and particularly preferably 6 to 12 carbon atoms, for example, phenyl pyridine, benzoquinoline, quinolinol, bipyridyl, phenanthrorine, or the like), diketone ligand (for example, acetyl acetone, or the like), carboxylic acid ligand (for example, having preferably 2 to 30 carbon atoms, more preferably 2 to 20 carbon atoms, and further preferably 2 to 16 carbon atoms, such as acetic acid ligand, or the like), alcoholato ligand (for example, having preferably 1 to 30 carbon atoms, more preferably 1 to 20 carbon atoms, and further preferably 6 to 20 carbon atoms, such as phenolato ligand, or the like), silyloxy ligand (for example, having preferably 3 to 40 carbon atoms, more preferably 3 to 30 carbon atoms, and further preferably 3 to 20 carbon atoms, such as trimethyl silyloxy ligand, dimethyl-tert-butyl silyloxy ligand, triphenyl silyloxy ligand, or the like), carbon monoxide ligand, isonitrile ligand, cyano ligand, phosphorus ligand (having preferably 3 to 40 carbon atoms, more preferably 3 to 30 carbon atoms, further preferably 3 to 20 carbon atoms, and particularly preferably 6 to 20 carbon atoms, such as triphenyl phosphine ligand or the like), thiolato ligand (having preferably 1 to 30 carbon atoms, more preferably 1 to 20 carbon atoms, and further preferably 6 to 20 carbon atoms, such as phenyl thiolato ligand or the like), and phosphine oxide ligand (having preferably 3 to 30 carbon atoms, more preferably 8 to 30 carbon atoms, and further preferably 18 to 30 carbon atoms, for example, triphenyl phosphine oxide ligand or the like), and more preferably nitrogen-containing heterocyclic ligand.

The above-described complexes may be either a complex containing one transition metal atom in the compound, or a so-called polynuclear complex containing two or more transition metal atoms wherein different metal atoms may be contained at the same time.

Among these, specific examples of the light-emitting dopants include phosphorescent light-emitting compounds described in patent documents such as U.S. Pat. Nos. 6,303,238B1, and 6,097,147; International Patent Publication (WO) Nos. 00/57676, 00/70655, 01/08230, 01/39234A2, 01/41512A1, 02/02714A2, 02/15645A1, 02/44189A1, and 05/19373A2; JP-A Nos. 2001-247859, 2002-302671, 2002-117978, 2003-133074, 2002-235076, 2003-123982, and 2002-170684; European Patent (EP) No. 1211257; JP-A Nos. 2002-226495, 2002-234894, 2001-247859, 2001-298470, 2002-173674, 2002-203678, 2002-203679, 2004-357791, 2006-256999, 2007-19462, 2007-84635, 2007-96259, etc. Among these, more preferable examples of the light-emitting dopants include Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes.

Particularly preferable are Ir complexes, Pt complexes, and Re complexes; and among these, Ir complexes, Pt complexes, and Re complexes each containing at least one coordination mode of metal-carbon bonds, metal-nitrogen bonds, metal-oxygen bonds, and metal-sulfur bonds are preferred. Particularly preferably, Ir complexes, Pt complexes, and Re complexes each containing a tri- or higher-dentate ligand are preferred in view of light-emission efficiency, drive durability, color purity and the like.

<<Fluorescent Light-Emitting Dopant>>

Examples of the above-described fluorescent light-emitting dopants generally include benzoxazole, benzimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidine compounds, condensed polycyclic aromatic compounds (anthracene, phenanthroline, pyrene, perylene, rubrene, pentacene and the like), a variety of metal complexes represented by metal complexes of 8-quinolinol, pyromethene complexes or rare-earth complexes, polymer compounds such as polythiophene, polyphenylene or polyphenylenevinylene, organic silanes, and derivatives thereof.

Among these, specific examples of the light-emitting dopants include the following compounds, but it should be noted that the present invention is not limited thereto.

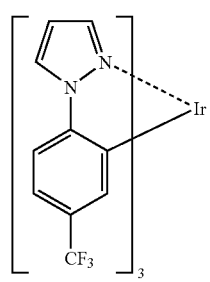

D-1

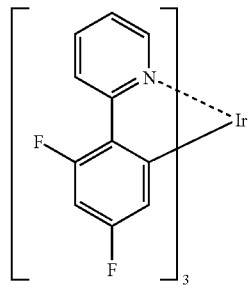

D-2

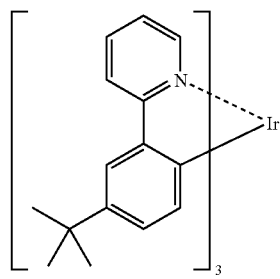

D-3

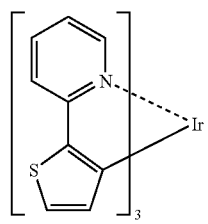

D-4

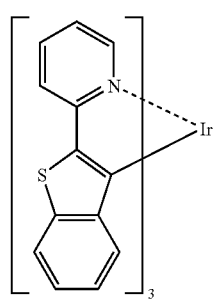

D-5

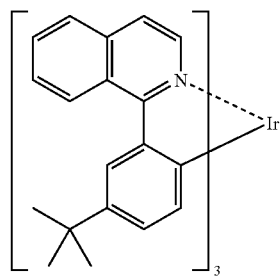

D-6

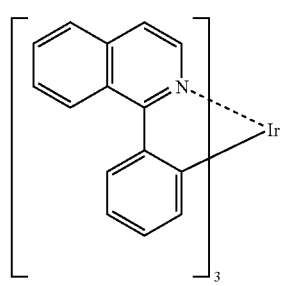

D-7

-continued
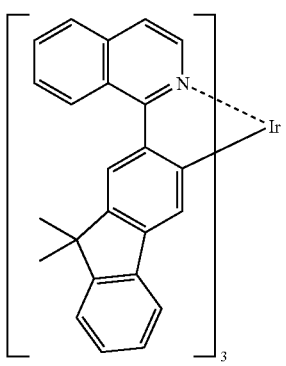
D-8
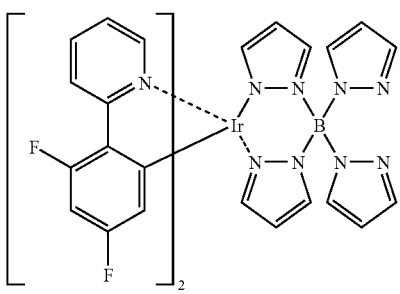
D-9
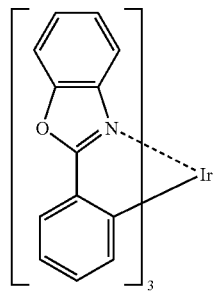
D-10
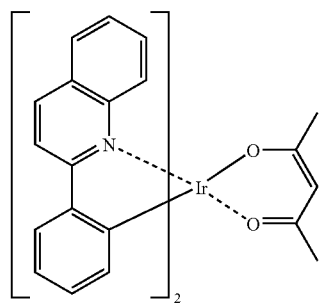
D-11
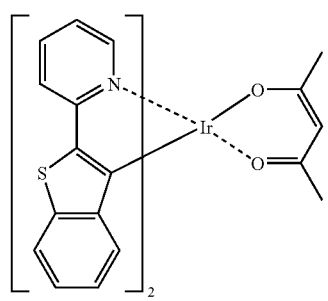
D-12
-continued
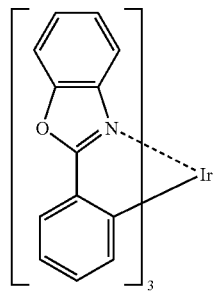
D-13
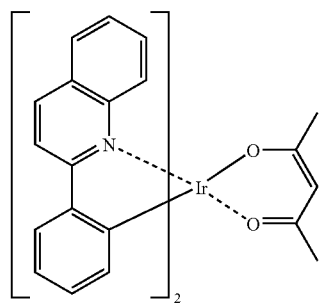
D-14
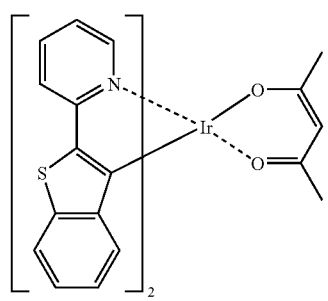
D-15
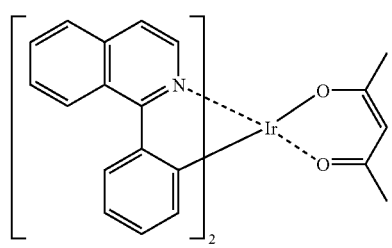
D-16
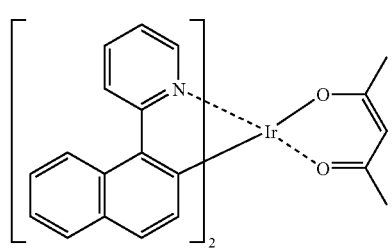
D-17
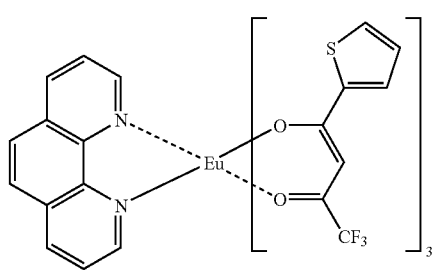
D-18

D-19
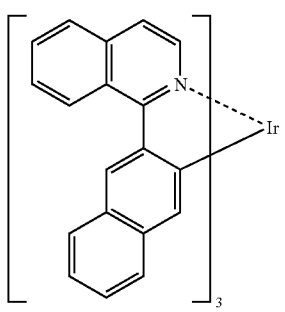
D-20
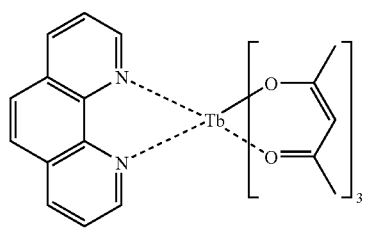
D-21
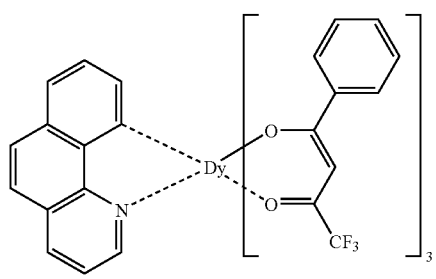
D-22
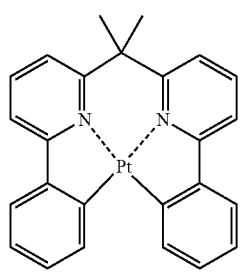
D-23
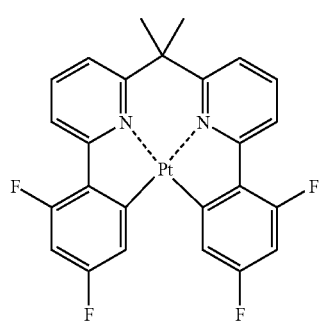
D-24
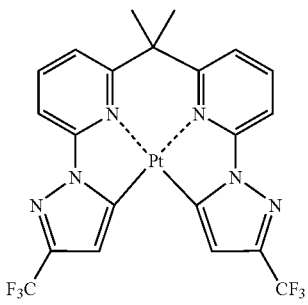
D-25
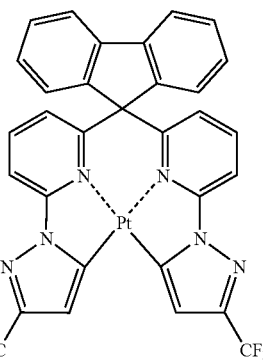
D-26
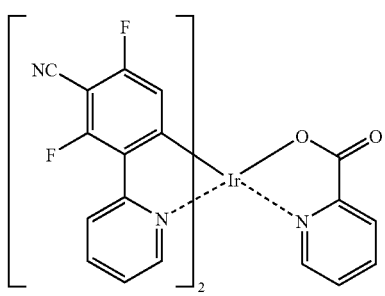
D-27
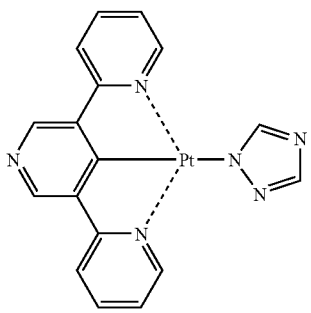
D-28
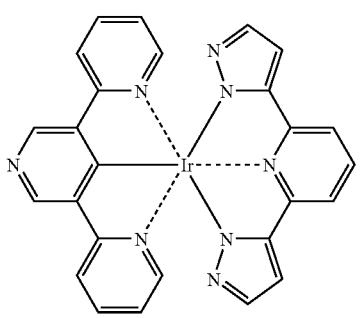

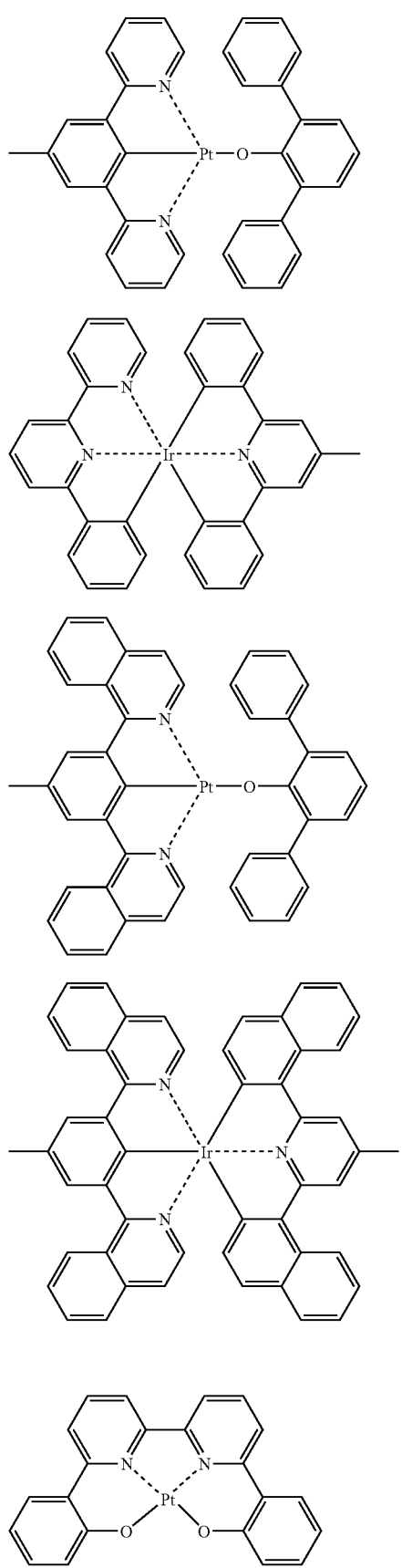
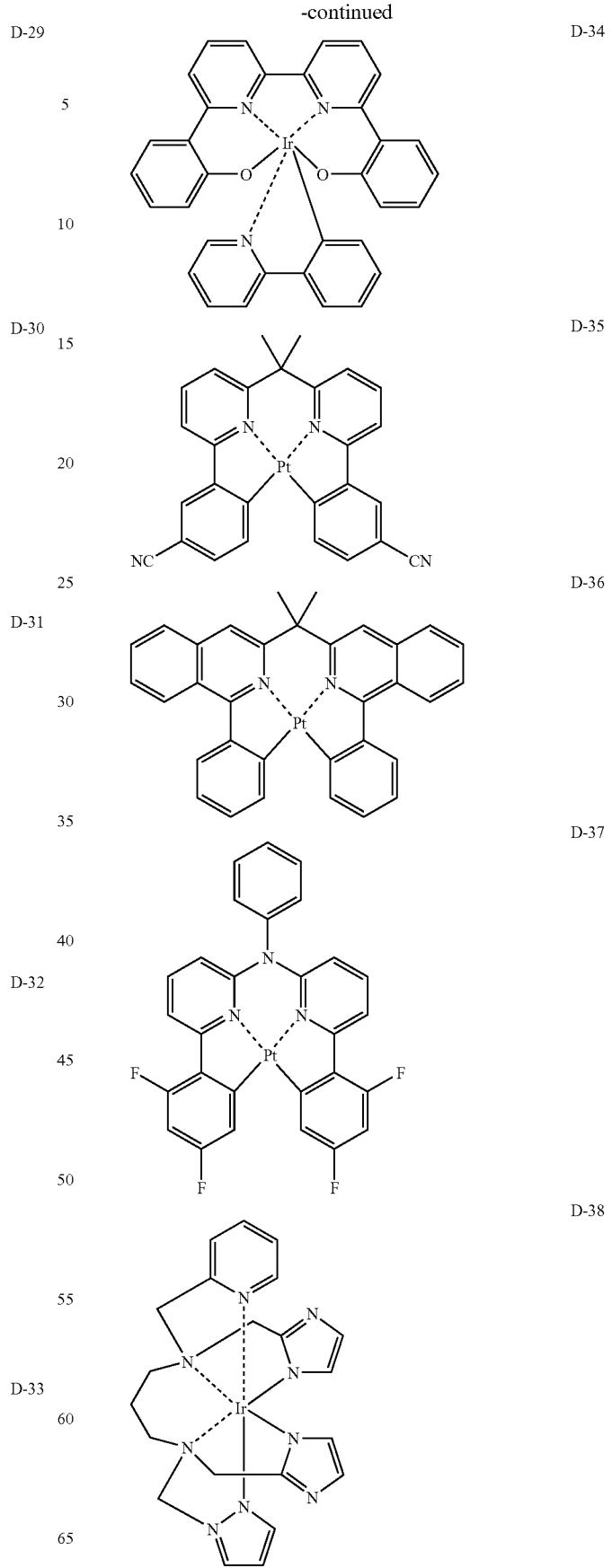

D-39

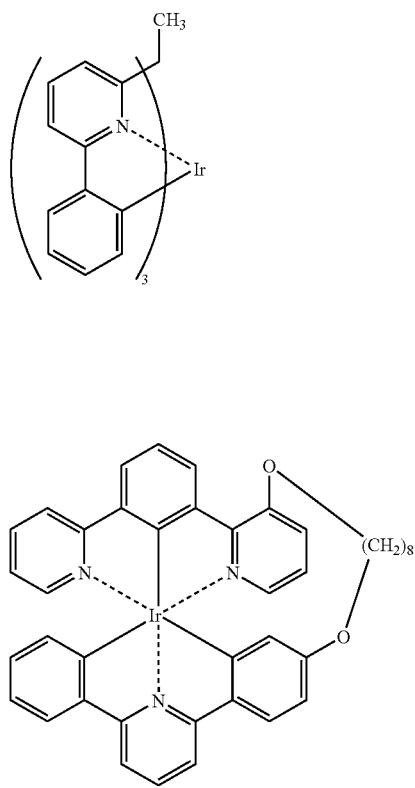

D-40

D-41

D-42

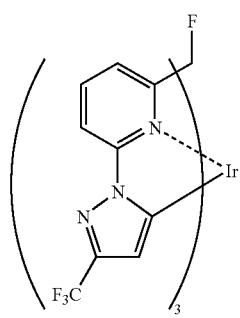

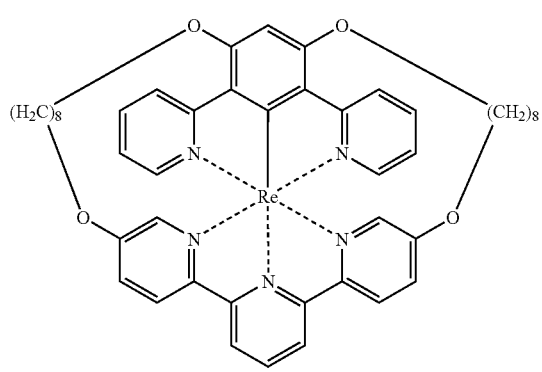

D-43

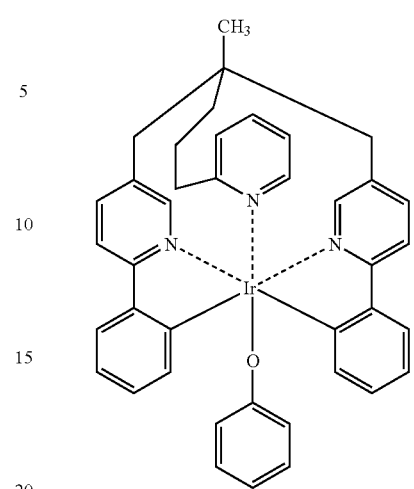

The light-emitting dopant in the light-emitting layer is contained in an amount of from 0.1% by weight to 50% by weight with respect to the total weight of the compounds generally forming the light-emitting layer, but it is preferably contained in an amount of from 1% by weight to 50% by weight, and more preferably in an amount of from 2% by weight to 40% by weight in view of drive durability and external quantum efficiency.

Although a thickness of the light-emitting layer is not particularly limited, 2 nm to 500 nm is usually preferred, and within this range, 3 nm to 200 nm is more preferred, and 5 nm to 100 nm is even more preferred in view of external quantum efficiency.

<Host Material>

As the host materials to be used in the present invention, hole transporting host materials excellent in hole transporting property (referred to as a "hole transporting host" in some cases) and electron transporting host compounds excellent in electron transporting property (referred to as an "electron transporting host" in some cases) may be used.

<<Hole Transporting Host>>

Specific examples of the hole transporting hosts used in the present invention include pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electrically conductive high-molecular oligomers such as thiophene oligomers, polythiophenes and the like, organic silanes, carbon films, derivatives thereof, and the like.

Among these, indole derivatives, carbazole derivatives, aromatic tertiary amine compounds, and thiophene derivatives are preferable, and compounds containing a carbazole group in the molecule are more preferable. Particularly, compounds containing t-butyl substituted carbazole group are preferred.

<<Electron Transporting Host>>

As the electron transporting host included in the light-emitting layer in the present invention, it is preferred that an electron affinity Ea of the host is from 2.5 eV to 3.5 eV, more preferably from 2.6 eV to 3.4 eV, and even more preferably from 2.8 eV to 3.3 eV in view of improvement in durability and decrease in driving voltage. Furthermore, it is preferred that an ionization potential Ip of the host is from 5.7 eV to 7.5 eV, more preferably from 5.8 eV to 7.0 eV, and even more preferably from 5.9 eV to 6.5 eV in view of improvement in drive durability and decrease in driving voltage.

Specific examples of such electron transporting hosts include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyrazine, fluorine-substituted aromatic compounds, aromatic ring tetracarboxylic anhydrides of naphthalene, perylene or the like, phthalocyanine, derivatives thereof (which may form a condensed ring with another ring), and a variety of metal complexes represented by metal complexes of 8-quinolinol derivative, metal phthalocyanine, and metal complexes having benzoxazole or benzothiazole as the ligand.

Preferable electron transporting hosts are metal complexes, azole derivatives (benzimidazole derivatives, imidazopyridine derivatives and the like), and azine derivatives (pyridine derivatives, pyrimidine derivatives, triazine derivatives and the like). Among these, metal complex compounds are preferred in the present invention in view of durability. As the metal complex compound, a metal complex containing a ligand having at least one nitrogen atom, oxygen atom, or sulfur atom to be coordinated to the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and even more preferable is an aluminum ion, a zinc ion, or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU—(Organometallic Chemistry—Fundamental and Application—)" authored by Akio Yamamoto, published by Shokabo Publishing Co., Ltd. in 1982, and the like.

The ligands are preferably nitrogen-containing heterocyclic ligands (having preferably 1 to 30 carbon atoms, more preferably 2 to 20 carbon atoms, and particularly preferably 3 to 15 carbon atoms); and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like);

heteroaryloxy ligands (those having preferably 1 to 30 carbon atoms, more preferably 1 to 20 carbon atoms, and particularly preferably 1 to 12 carbon atoms, examples of which include pyridyloxy, pyrazinyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, 2-benzoxazolylthio, 2-benzothiazolylthio and the like);

siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, aromatic hydrocarbon anion ligands, aromatic heterocyclic anion ligands or siloxy ligands are preferable, and nitrogen-containing heterocyclic ligands, aryloxy ligands, siloxy ligands, aromatic hydrocarbon anion ligands, or aromatic heterocyclic anion ligands are more preferable.

Examples of the metal complex electron transporting hosts include compounds described, for example, in JP-A Nos. 2002-235076, 2004-214179, 2004-221062, 2004-221065, 2004-221068, 2004-327313 and the like.

In the light-emitting layer according to the present invention, it is preferred that the lowest triplet excitation level (T1) of the host material is higher than T1 of the phosphorescent light-emitting material in view of color purity, light-emission efficiency, and drive durability.

Although a content of the host compounds according to the present invention is not particularly limited, it is preferably from 15% by weight to 95% by weight with respect to the total weight of the compounds forming the light-emitting layer in view of light-emission efficiency and driving voltage.

(Hole Injection Layer and Hole Transport Layer)

The hole injection layer and hole transport layer are layers functioning to receive holes from an anode or from an anode side and to transport the holes to a cathode side. Materials to be introduced into the hole injection layer or hole transport layer is not particularly limited, but either of a low molecular compound or a high molecular compound may be used.

As a material for the hole injection layer and the hole transport layer, it is preferred to contain specifically pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organic silane derivatives, carbon, or the like.

An electron-accepting dopant may be introduced into the hole injection layer or the hole transport layer in the organic EL element according to the present invention. As the electron-accepting dopant to be introduced into the hole injection layer or the hole transport layer, either of an inorganic compound or an organic compound may be used as long as the compound has electron accepting property and a function for oxidizing an organic compound.

Specifically, the inorganic compound includes metal halides, such as iron (III) chloride, aluminum chloride, gallium chloride, indium chloride and antimony pentachloride and the like, and metal oxides, such as vanadium pentaoxide, molybdenum trioxide and the like.

In the case of applying organic compounds, compounds having a substituent such as a nitro group, a halogen atom, a cyano group, a trifluoromethyl group or the like; quinone compounds; acid anhydride compounds; fullerenes; and the like may be preferably applied. Specific examples thereof other than those above include compounds described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene C60 are preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine are more preferred, and tetrafluorotetracyanoquinodimethane is particularly preferred.

These electron-accepting dopants may be used alone or in a combination of two or more of them.

Although an applied amount of these electron-accepting dopants depends on the type of material, 0.01% by weight to 50% by weight of a dopant is preferred with respect to a hole transport layer material, 0.05% by weight to 20% by weight is more preferable, and 0.1% by weight to 10% by weight is particularly preferred.

A thickness of the hole injection layer and a thickness of the hole transport layer are each preferably 500 nm or less in view of decrease in driving voltage.

The thickness of the hole transport layer is preferably from 1 nm to 500 nm, more preferably from 5 nm to 200 nm, and even more preferably from 10 nm to 100 nm. The thickness of the hole injection layer is preferably from 0.1 nm to 200 nm, more preferably from 0.5 nm to 100 nm, and even more preferably from 1 nm to 100 nm.

The hole injection layer and the hole transport layer may be composed of a monolayer structure comprising one or two or more of the above-mentioned materials, or a multilayer structure composed of plural layers of a homogeneous composition or a heterogeneous composition.

(Electron Injection Layer and Electron Transport Layer)

An electron injection layer and an electron transport layer are layers having any of functions for receiving electrons from a cathode or a cathode side, and transporting electrons to an anode side. An electron injection material or an electron transport material to be introduced therein may be either of a low molecular compound or a high molecular compound.

Specific examples of the materials include pyridine derivatives, quinoline derivatives, pyrimidine derivatives, pyrazine derivatives, phthalazine derivatives, phenanthoroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyradine derivatives, aromatic ring tetracarboxylic anhydrides of perylene or naphthalene, phthalocyanine derivatives, metal complexes represented by metal complexes of 8-quinolinol derivative, metal phthalocyanine, and metal complexes containing benzoxazole or benzothiazole as the ligand, organic silane derivatives represented by silole, and the like.

The electron injection layer or the electron transport layer in the organic EL element according to the invention may contain an electron donating dopant. As the electron donating dopant introduced in the electron injection layer or the electron transport layer, any material may be used as long as it has an electron-donating property and a property for reducing an organic compound; and alkaline metals such as Li, alkaline earth metals such as Mg, transition metals including rare-earth metals, and reducing organic compounds are preferably used. As the metals, particularly, metals having a work function of 4.2 V or less are preferably applied, and specific examples thereof include Li, Na, K, Be, Mg, Ca, Sr, Ba, Y, Cs, La, Sm, Gd, Yb, and the like. Specific examples of the reducing organic compounds include nitrogen-containing compounds, sulfur-containing compounds, phosphorus-containing compounds, and the like.

In addition, materials described in JP-A Nos. 6-212153, 2000-196140, 2003-68468, 2003-229278 and 2004-342614 may be used.

These electron donating dopants may be used alone or in a combination of two or more of them. An applied amount of the electron donating dopants differs dependent on the types of the materials, but it is preferably from 0.1% by weight to 99% by weight with respect to an electron transport layer material, more preferably from 1.0% by weight to 80% by weight, and even more preferably from 2.0% by weight to 70% by weight.

A thickness of the electron injection layer and a thickness of the electron transport layer are each preferably 500 nm or less in view of decrease in driving voltage.

The thickness of the electron transport layer is preferably from 1 nm to 500 nm, more preferably from 5 nm to 200 nm, and even more preferably from 10 nm to 100 nm. The thickness of the electron injection layer is preferably from 0.1 nm to 200 nm, more preferably from 0.2 nm to 100 nm, and even more preferably from 0.5 nm to 50 nm.

The electron injection layer and the electron transport layer may be composed of a monolayer structure comprising one or two or more of the above-mentioned materials, or a multilayer structure composed of plural layers of a homogeneous composition or a heterogeneous composition.

(Hole Blocking Layer)

A hole blocking layer is a layer having a function to prevent the holes transported from the anode side to the light-emitting layer from passing through to the cathode side. According to the present invention, a hole blocking layer may be provided as an organic compound layer adjacent to the light-emitting layer on the cathode side.

Examples of the compound constituting the hole blocking layer include an aluminum complex such as BAlq (aluminium (III) bis(2-methyl-8-quinolinato)-4-phenylphenolate), a triazole derivative, a phenanthroline derivative such as BCP (2,9-dimethyl-4,7-diphenyl-1,10-phenanthroline), and the like.

A thickness of the hole blocking layer is preferably from 1 nm to 500 nm, more preferably from 5 nm to 200 nm, and even more preferably from 10 nm to 100 nm.

The hole blocking layer may have either a monolayer structure comprising one or two or more of the above-mentioned materials, or a multilayer structure composed of plural layers of a homogeneous composition or a heterogeneous composition.

(Electron Blocking Layer)

An electron blocking layer is a layer having a function to prevent the electrons transported from the cathode side to the light-emitting layer from passing through to the anode side. According to the present invention, an electron blocking layer may be provided as an organic compound layer adjacent to the light-emitting layer on the anode side.

Specific examples of the compound constituting the electron blocking layer include compounds explained above as a hole-transporting material.

A thickness of the electron blocking layer is preferably from 1 nm to 500 nm, more preferably from 5 nm to 200 nm, and even more preferably from 10 nm to 100 nm.

The electron blocking layer may have either a monolayer structure comprising one or two or more of the above-mentioned materials, or a multilayer structure composed of plural layers of a homogeneous composition or a heterogeneous composition.

(Protective Layer)

According to the present invention, the whole organic EL element may be protected by a protective layer.

It is sufficient that a material contained in the protective layer is one having a function to prevent penetration of substances such as moisture and oxygen, which accelerate deterioration of the element, into the element.

Specific examples thereof include metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence element according to the present invention may be sealed with a sealing cap.

Furthermore, a moisture absorbent or an inert liquid may be used to seal a space defined between the sealing cap and the light-emitting element. Although the moisture absorbent is not particularly limited, specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorocarbon solvents such as perfluoroalkanes, perfluoroamines, perfluoroethers and the like; chlorine-based solvents; silicone oils; and the like.

A sealing method by a resin sealing layer, which is described below, is also preferably applied.

(Resin Sealing Layer)

A functional element according to the present invention is preferably prevented by the resin sealing layer from contact with the atmosphere to result in deterioration in performance of the element by oxygen or moisture.

<Material>

The resin material for the resin sealing layer is not particularly limited and an acrylic resin, an epoxy resin, a fluorocarbon resin, a silicone resin, a rubber resin, or an ester resins can be used. Among these, an epoxy resin is preferred in view of moisture preventive function. In the epoxy resin, a thermosetting epoxy resin, or a photo-curable epoxy resin is preferred.

<Manufacturing Method>

The manufacturing method of the resin sealing layer is not particularly limited and includes, for example, a method of coating a resin solution, a method of press bonding or hot press bonding a resin sheet, and a method of dry polymerization by vapor deposition, sputtering, etc.

<Film Thickness>

The thickness of the resin sealing layer is preferably from 1 μm to 1 mm. It is more preferably from 5 μm to 100 μm, and most preferably from 10 μm to 50 μm. In the case where the thickness is smaller than 1 μm, the inorganic layer described above may possibly be damaged upon mounting of the second substrate. Further, in the case where the thickness is larger than 1 mm, the thickness of the electroluminescence element per se increases to damage the thin film property, which is a feature of the organic electroluminescence element.

(Sealing Adhesive)

The sealing adhesive used in the invention has a function of preventing intrusion of moisture or oxygen from the edge.

<Material>

As the material for the sealing adhesive, those identical with the materials used in the resin sealing layer can be used. Among all, an epoxy adhesive is preferred in view of preventing moisture, and among these, a photo-curable type adhesive or a thermosetting type adhesive is preferred.

Further, addition of filler to the materials described above is also preferred.

The filler added to the sealant is preferably an inorganic material such as $SiO_2$, SiO (silicon oxide), SiON (silicon oxynitride), or SiN (silicon nitride). The addition of the filler increases the viscosity of the sealant to improve workability and to improve humidity resistance.

<Drying Agent>

The sealing adhesive may also contain a drying agent. The drying agent is preferably barium oxide, calcium oxide, or strontium oxide.

The addition amount of the drying agent with respect to the amount of the sealing adhesive is preferably from 0.01% by weight to 20% by weight, and more preferably from 0.05% by weight to 15% by weight. The addition effect of the drying agent is reduced in the case where the amount is smaller than 0.01% by weight. Further, it is difficult to uniformly disperse the drying agent in the sealing adhesive in the case where the amount is larger than 20% by weight, which is not preferred.

<Formulation of Sealing Adhesive>

—Polymer Composition and Concentration—

The sealing adhesive is not particularly limited, and those described above can be used. For example, the photo-curable epoxy type adhesive includes XNR5516 manufactured by Nagase Chemtech Co. and the drying agent may be directly added to and dispersed therein.

—Thickness—

The coating thickness of the sealing adhesive is preferably from 1 µm to 1 mm. In the case where the thickness is smaller than 1 µm, the sealing adhesive can not be coated uniformly, which is not preferred. Further, in the case where the thickness is larger than 1 mm, moisture intrusion paths are increased, which is not preferred.

<Sealing Method>

In the invention, the sealing adhesive including the drying agent is coated in an optional amount by a dispenser or the like, a second substrate is stacked after coating, and they can be cured to obtain a functional element.

(Driving)

In the organic EL element according to the present invention, when DC (AC components may be contained as needed) voltage (usually 2 volts to 15 volts) or DC is applied between the anode and the cathode, light emission can be obtained.

For the driving method of the organic EL element according to the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

In the organic EL element according to the present invention, the light-extraction efficiency can be improved by various known methods. It is possible to improve light-extraction efficiency and to improve external quantum efficiency, for example, by modifying the surface shape of the substrate (for example by forming fine irregularity pattern), by controlling the refractive index of the substrate, the ITO layer and/or the organic layer, or by controlling the thickness of the substrate, the ITO layer and/or the organic layer.

The organic EL element according to the present invention may have a so-called top-emission configuration in which the emitted light is extracted from the anode side.

The organic EL element according to the present invention may have a configuration of having an electric charge-generating layer provided between a plurality of light-emitting layers for a purpose to enhance light emission efficiency.

The electric charge-generating layer has a function of generating electric charges (holes or electrons) during an application of an electric field as well as a function of injecting the generated electric charges into a layer adjacent to the electric charge-generating layer.

The electric charge-generating layer is formed by any material as long as it has the aforementioned functions, and may be formed by a single compound or a plurality of compounds.

Specific examples of the materials for the electric charge-generating layer include electrically conductive materials, semi-conductive materials such as doped organic compound layers, and electric insulating materials; and materials described in JP-A Nos. 11-329748, 2003-272860 and 2004-39617 are described.

More specific examples thereof include transparent electrically conductive materials such as indium tin oxide (ITO) and indium zinc oxide (IZO); fullerenes such as C60; electrically conductive organic substances such as thiophene oligomers; electrically conductive organic substances such as metal phthalocyanines, non-metal phthalocyanines, metal porphyrins and non-metal porphyrins; metal materials such as Ca, Ag, Al, Mg—Ag alloy, Al—Li alloy and Mg—Li alloy; hole conductive materials; electron conductive materials, and mixtures thereof.

Specific examples of the hole conductive material include those in which hole transfer organic materials such as 4,4',4"-tris(2-naththylphenylamino)triphenylamine (2-TNATA) or N,N'-dinaphthyl-N,N'-diphenyl-[1,1'-biphenyl]-4,4'-diamine (NPD) are doped with oxidants having electron attracting properties such as 2,3,5,6-tetra-fluoro-7,7,8,8-tetra-cyano-quinodimethane (F4-TCNQ), 7,7,8,8-tetra-cyano-quinodimethane (TCNQ), or $FeCl_3$, P-type electrically conductive polymers, and P-type semiconductors. Specific examples of the electron conductive material include those in which electron transport organic materials are doped with metals or metal compounds having a work function of less than 4.0 eV, N-type electrically conductive polymers, and an N-type semiconductors. Specific examples of the N-type semiconductors include N-type Si, N-type CdS, N-type ZnS and the like. Specific examples of the P-type semiconductors include P-type Si, P-type CdTe, P-type CuO and the like.

Further, the electric charge-generating layer may include an electric insulating material such as $V_2O_5$.

The electric charge-generating layer can be formed by a single layer or a lamination of a plurality of layers. Specific examples of a structure of the lamination of a plurality of layers include a structure of a lamination of an electrically conductive material such as a transparent conductive material or a metal material and a hole conductive material or an electron conductive material, a structure of a lamination of the hole conductive material and the electron conductive material described above, and the like.

Preferably, a film thickness and a material of the electric charge-generating layer can be selected such that a transmittance of visible light becomes 50% or more. Further, the film thickness is not particularly limited; however, it is preferably from 0.5 nm to 200 nm, more preferably from 1 nm to 100 nm, further preferably from 3 nm to 50 nm, and particularly preferably from 5 nm to 30 nm.

A method of preparing the electric charge-generating layer is not particularly limited, and the above-described method of preparing organic compound layers can be used.

The electric charge-generating layer is formed between the two or more light-emitting layers. However, a material having a function of injecting an electric charge into layers adjacent thereto may be contained in a region of the electric charge-generating layer on an anode side or cathode side. In order to increase injection ability of electrons into an adjacent layer on the anode side thereof, electron injecting compounds such as BaO, SrO, Li$_2$O, LiCl, LiF, MgF$_2$, MgO, and CaF$_2$ may be laminated on the anode side of the electric charge-generating layer.

Other than the materials according to the contents herein, materials for forming the electric charge-generating layer may be selected on the basis of the descriptions in JP-A No. 2003-45676, and U.S. Pat. Nos. 6,337,492, 6,107,734, and 6,872,472.

The organic EL element in the invention may have a resonator structure. For example, on a transparent substrate, a multi-layered film mirror comprising a plurality of stacked films of different reflective indexes, a transparent or semi-transparent electrode, a light-emitting layer, and a metal electrode are stacked. Light generated in the light-emitting layer repeats reflection and conducts oscillation between the multi-layered film mirror and the metal electrode as reflection plates.

In another preferred embodiment of the resonator structure, on a transparent substrate, a transparent or semi-transparent electrode and a metal electrode function respectively as reflection plates in which light generated in the light-emitting layer repeats reflection and conducts oscillation therebetween.

For forming the resonance structure, an optical channel length determined based on the effective refractive index of two reflection plates, and the refractive index and the thickness for each of the layers between the reflection plates are controlled to optimal values for obtaining a desired resonance wavelength.

A calculation formula in the case of the first embodiment is described in the specification of JP-A No. 9-180883, and the calculation formula in the case of the second embodiment is described in the specification of JP-A No. 2004-127795.

As a method for forming a full color-type organic EL display, there are known, for example, as described in *Monthly Display*, September 2000, pages 33 to 37, a tricolor light emission method which arranges organic EL elements emitting light corresponding to three primary colors (blue color (B), green color (G), and red color (R)) on a substrate respectively; a white color method which separates white light emitted by an organic EL element for white color emission into three primary colors through a color filter; and a color conversion method which converts a blue light emitted by an organic EL element for blue light emission into red color (R), and green color (G) through a fluorescent dye layer.

Further, by combining a plurality of organic EL elements of different light emission colors obtained by the methods described above, planar type light sources of desired emission colors can be obtained. For example, they include a white color light source obtained by a combination of blue and yellow light-emitting elements, and a white color light source obtained by a combination of blue, green and red color light-emitting elements.

3. Protective Insulating Layer

In the organic EL display of the invention, the whole organic EL element is protected with a protective insulating layer. The protective insulating layer has a function to reduce damage to the organic EL element during production of TFT on the organic EL element, and a function to electrically insulate the organic EL element and the TFT. It is further preferred for the protective insulating layer to have a function to prevent penetration of substances which accelerate deterioration of the element, such as moisture, oxygen and the like, into the element.

Specific examples of materials for the protective insulating layer include metal oxides such as MgO, SiO, SiO$_2$, Al$_2$O$_3$, GeO, NiO, CaO, BaO, Fe$_2$O$_3$, Y$_2$O$_3$, TiO$_2$ and the like; metal nitrides such as SiN$_x$, SiN$_x$O$_y$ and the like; metal fluorides such as MgF$_2$, LiF, AlF$_3$, CaF$_2$ and the like; polyethylene; polypropylene; polymethyl methacrylate; polyimide; polyurea; polytetrafluoroethylene; polychlorotrifluoroethylene; polydichlorodifluoro ethylene; a copolymer of chlorotrifluoro ethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective insulating layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

The upper electrode of the organic EL element and the source electrode or the drain electrode of the driver TFT are required to be electrically connected, and it is therefore necessary to form a contact hole in the protective insulating layer. A method of forming a contact hole includes a wet etching method using an etchant, a dry etching method using plasma and an etching method using laser.

(Applications)

The thin film field effect transistor of the invention can be used in an image display with a liquid crystal or EL element incorporated therein, and especially it can be used as a switching element or a driving element of an FPD. It is particularly suitable to use the thin film field effect transistor as a switching element or a driving element of a flexible FPD device. Further, a display incorporating the thin film field effect transistor of the invention has such wide ranging applications as a mobile phone display, a personal digital assistant (PDA), a computer display, a car information display, a TV monitor, and general illumination.

In addition to displays, the thin film field effect transistor of the invention can be applied extensively to e.g., IC cards, and ID tags, in which the thin film field effect transistor is formed on a flexible substrate such as an organic plastic film.

All publications, patent applications, and technical standards mentioned in this specification are herein incorporated by reference to the same extent as if each individual publication, patent application, or technical standard was specifically and individually indicated to be incorporated by reference.

EXAMPLES

In the following, the thin film field effect transistor of the present invention will be explained by examples thereof, but the invention is by no means limited by such examples.

Example 1

1. Preparation of TFT Element

1) Preparation of Inventive TFT Element
    <Preparation of n-Si Substrate>
    A substrate and a gate electrode were prepared as follows.
    An N-type Si substrate having a thickness of 0.5 mm (manufactured by Jemco Co., Ltd., electric resistance: from 1

Ωcm to 3.5 Ωcm) was used as a conductive N-type substrate, and this is used as both the substrate and the gate electrode.

<Gate Insulating Layer>

Next, on the gate electrode, the following gate insulating layer was formed.

Gate insulating layer: a gate insulating layer was provided by performing RF magnetron sputtering vacuum deposition of $SiO_2$ (conditions: target of $SiO_2$, temperature for film formation of 54° C., flow rates of sputtering gas $Ar/O_2=12$ sccm/2 sccm, RF power of 400 W, and film-forming pressure of 0.4 Pa) to form a layer having a thickness of 100 nm. Patterning of the $SiO_2$ gate insulating layer was performed using a shadow mask during sputtering.

<Active Layer>

Active layer 1: on the gate insulating layer, RF magnetron sputtering vacuum deposition was performed using a polycrystalline sintered body having a composition of $InGaZnO_4$ as a target under the following conditions: flow rate of Ar of 97 sccm, flow rate of $O_2$ of 1.7 sccm, RF power of 200 W, and total pressure of 0.4 Pa.

Active layer 2: indium-tin oxide (ITO) was deposited under the following conditions: flow rate of Ar of 12 sccm, flow rate of $O_2$ of 5.0 sccm, RF power of 200 W, and total pressure of 0.4 Pa.

The thickness of the active layer was adjusted to the thickness shown in Table 1 by adjusting the time for deposition.

Patterning of the active layer was performed using a shadow mask during sputtering.

<Electric Resistance Layer>

Electric resistance layer: on the active layer, an electric resistance layer was provided by performing sputtering of gallium oxide ($Ga_2O_3$) or $InGaZ_nO_4$, and co-sputtering of $IGZO/Ga_2O_3$ under the following preparation conditions.

Sputtering conditions: concerning gallium oxide, RF magnetron sputtering was performed using a composition of $Ga_2O_3$ as a target, under the following conditions: flow rate of Ar of 12 sccm, flow rate of $O_2$ of 5.0 sccm, RF power of 400 W, and total pressure of 0.4 Pa. Concerning $InGaZnO_4$ or IGZO in the case of co-sputtering of $IGZO/Ga_2O_3$, a composition of $InGaZnO_4$ was used as a target, and the conditions were as follows: flow rate of Ar of 12 sccm, flow rate of $O_2$ of 5.0 sccm, RF power of 400 W, and total pressure of 0.4 Pa.

The deposition thickness was adjusted to the thickness shown in Table 1 by adjusting the time for deposition.

Then, on the electric resistance layer, aluminum metal (Al) with a thickness of 400 nm was deposited as a source electrode and a drain electrode, by resistance heating deposition (temperature for film formation: 25° C.).

Patterning of the source electrode and drain electrode was performed by a photo resist method, which was conducted by a generally known means. Thereby, a TFT element having a channel length (L) of 200 μm and a channel width (W) of 1000 μm was formed.

2) Preparation of Comparative TFT Element

Preparation of comparative TFT element Nos. 1, 2, 3, 5, 6, and 7 was conducted in a similar manner to the process in the preparation of the inventive TFT elements, except that, in the preparation of inventive TFT elements, the electric resistance layer was removed, and the material and the thickness of the active layer were adjusted to those shown in Table 1.

Comparative element No. 8 was prepared to have a configuration in which an active layer (IGZO layer) was disposed on the side of the source electrode and drain electrode, and an electric resistance layer was disposed on the side of the gate insulating layer. Comparative element No. 4 was prepared in a similar manner to the process in the preparation of the inventive element No. 1, except that the thickness of the electric resistance layer was reduced to 1 nm.

2. Performance Evaluation

For each of the obtained TFT elements, designating the source electrode as 0 (zero) V, the TFT transfer characteristics at a drain voltage Vd in a saturation region of +40 V (gate voltage (Vg) satisfying: $-20V \leq Vg \leq +40V$) were measured, and performance of TFT was evaluated. The measurement of the TFT transfer characteristics was performed using a semiconductor parameter analyzer 4156C (manufactured by Agilent Technologies). Each parameter and its definition in the present invention are as follows.

Threshold voltage (Vth) of TFT: threshold voltage (Vth) of TFT is determined as follows: a graph in which the horizontal axis indicates Vg, and the vertical axis indicates a square root of Isd (current between the source electrode and the drain electrode) is prepared, and by extrapolating a straight line, the Vg at Isd=0 is determined, which is taken as the threshold voltage (Vth) of TFT (see Table 5). It is because, in the saturated region, Isd, Vg, and Vth have a relationship according to the following equation 1. The unit is [V].

$$Isd^{1/2} \propto (W\mu/2L)^{1/2}(Vg-Vth) \qquad \text{(Equation 1)}$$

In the equation, W denotes the channel width, L denotes the channel length, and μ represents mobility of the active layer.

ON current (Ion): Ion is a drain current at Vg=+40 V. The unit is [A].

Threshold voltage by first action ($Vth_0$): the Vth, when each TFT element is subjected to driving at Vsd (voltage between the source electrode and the drain electrode)=+40 V, and Vg=-20 V to +40 V, is measured. The unit is [V].

Shift quantity of threshold voltage (Vth $shift_1$): each TFT element is subjected to driving for four times continuously (Vsd (voltage between the source electrode and the drain electrode)=+40 V; Vg=-20 V to +40 V). Vth is measured with respect to each TFT element, and a quantity of variation in Vth by the four-time driving is determined as Vth $shift_1$. The unit is [V].

Vth $shift_1$ shows a degree of influence on driving hysteresis. The smaller the Vth $shift_1$ is, the more preferable.

The TFT characteristics obtained by the above measurement results are shown in Table 1.

From the results shown in Table 1, it is revealed that the inventive TFT elements exhibit small Vth $shift_1$ and show excellent effects on improving hysteresis.

Particularly, the inventive element No. 6 exhibits negative $Vth_0$ and small Vth $shift_1$, and is the most excellent element among the obtained elements.

When comparing the inventive element No. 1 and the inventive element No. 2, the inventive element No. 2 having a thicker electric resistance layer exhibits smaller Vth $shift_1$ and is more preferable. Similarly, when comparing the inventive element No. 4 and the inventive element No. 5, the inventive element No. 5 having a thicker electric resistance layer shows more preferable results.

On the contrary, the comparative TFT elements exhibit great Vth $shift_1$ and great driving hysteresis, resulting in unstable driving, as compared with the inventive TFT elements.

In particular, the comparative element No. 8, in which the active layer having a smaller band gap is disposed on the side of the source electrode and drain electrode, exhibits extremely high Vth $shift_1$.

TABLE 1

| TFT Element No. | Active Layer Material | Active Layer Thickness (nm) | Electric Resistance Layer Material | Electric Resistance Layer Thickness (nm) | $Vth_0$ (V) | $Vth\ Shift_1$ (V) |
|---|---|---|---|---|---|---|
| Inventive Element No. 1 | IGZO | 5 | $Ga_2O_3$ | 5 | −2 | 0.9 |
| Inventive Element No. 2 | IGZO | 5 | $Ga_2O_3$ | 10 | 1 | 0.4 |
| Inventive Element No. 3 | IGZO | 10 | $Ga_2O_3$ | 10 | −4 | 0.7 |
| Inventive Element No. 4 | ITO | 2.5 | $Ga_2O_3$ | 10 | −18 | 3.1 |
| Inventive Element No. 5 | ITO | 2.5 | $Ga_2O_3$ | 50 | −1 | 2.6 |
| Inventive Element No. 6 | IGZO | 5 | IGZO + $Ga_2O_3$/$Ga_2O_3$ | 10/10 | −2 | 0.5 |
| Comparative Element No. 1 | IGZO | 5 | — | — | −1 | 4.0 |
| Comparative Element No. 2 | IGZO | 10 | — | — | −1 | 17.0 |
| Comparative Element No. 3 | IGZO | 50 | — | — | −2 | 19.0 |
| Comparative Element No. 4 | IGZO | 5 | $Ga_2O_3$ | 1 | −1 | 5.0 |
| Comparative Element No. 5 | ITO | 2.5 | — | — | No action | No action |
| Comparative Element No. 6 | $Ga_2O_3$ | 10 | — | — | No action | No action |
| Comparative Element No. 7 | $Ga_2O_3$ | 50 | — | — | No action | No action |
| Comparative Element No. 8 | $Ga_2O_3$ | 10 | IGZO | 50 | 0 | 28.0 |

Example 2

TFT elements were prepared in a similar manner to that in Example 1, except that a barrier-attached film having the following insulating layer, which has a function of barrier, on both sides of a polyethylene naphthalate film (having a thickness of 100 μm) was used instead of the n-Si substrate in Example 1.

Insulating layer: SiON was deposited to give a thickness of 500 nm. For the deposition of SiON, an RF magnetron sputtering deposition method (conditions for sputtering: target of $Si_3N_4$, RF power of 400 W, flow rates of gas $Ar/O_2$=12 sccm/3 sccm, and film-forming pressure of 0.45 Pa) was applied.

The obtained elements were evaluated in a similar manner to that in Example 1. As a result, the inventive elements exhibited a small shift quantity of threshold voltage, similar to the results in Example 1.

Example 3

1. Preparation of Organic EL Display (Preparation of Organic EL Element Part)
1) Formation of Lower Electrode As a substrate, the above barrier-attached film including an insulating layer having a function of barrier on both sides of a polyethylene naphthalate film was used. On the substrate, indium-tin oxide (which is referred to hereinafter as ITO) was deposited at a thickness of 150 nm to form an anode.

2) Formation of Organic Layer

After cleaning, a hole injection layer, a hole transport layer, a light-emitting layer, a hole blocking layer, an electron transport layer and an electron injection layer were disposed in this order.

The composition of each layer is as follows. Each layer was provided by resistance heating vacuum deposition.

Hole injection layer: a layer containing 4,4',4"-tris(2-naphthylphenylamino)triphenylamine (which is referred to as 2-TNATA) and 2,3,5,6-tetrafluoro-7,7,8,8-tetracyanoquinodimethane (which is referred to as F4-TCNQ), wherein the amount of F4-TCNQ was 1% by weight with respect to the amount of 2-TNATA; at a thickness of 160 nm.

Hole transport layer: N,N'-dinaphthyl-N,N'-diphenyl-[1,1'-biphenyl]-4,4'-diamine (which is referred to as α-NPD); at a thickness of 10 nm.

Light-emitting layer: a layer containing 1,3-bis(carbazol-9-yl)benzene (which is referred to as mCP) and platinum complex Pt-1, wherein the amount of Pt-1 was 13% by weight with respect to the amount of mCP; at a thickness of 60 nm.

Hole blocking layer: aluminium (III) bis(2-methyl-8-quinolinato)-4-phenylphenolate (which is referred to as BAlq); at a thickness of 40 nm.

Electron transport layer: tris(8-hydroxyquinolinato) aluminum (which is referred to as Alq3); at a thickness of 10 nm.

Electron injection layer: lithium fluoride (LiF); at a thickness of 1 nm.

3) Formation of Upper Electrode

Patterning was performed using a shadow mask so that the size of the element would be 2 mm×2 mm, and Al was deposited at a thickness of 100 nm to form a cathode.

(Protective Insulating Layer)

On the upper electrode, as a protective insulating layer, an SiON layer with a thickness of 500 nm was formed by an ion plating method. After forming the layer, a contact hole was formed by a laser beam.

Chemical structures of the compounds used in Examples are shown below.

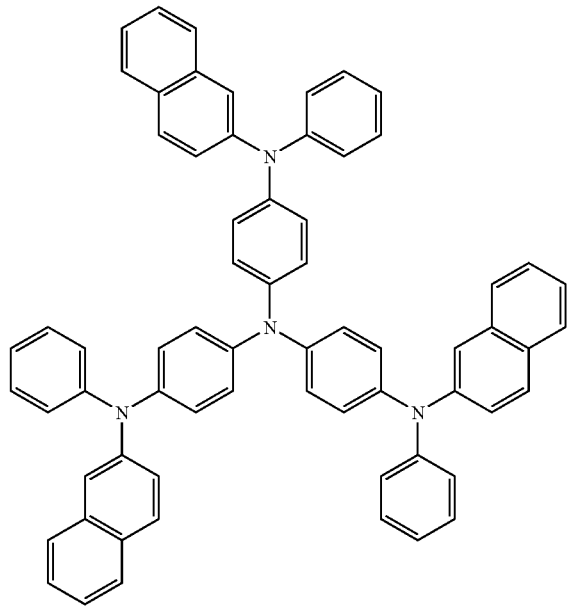

2-TNATA

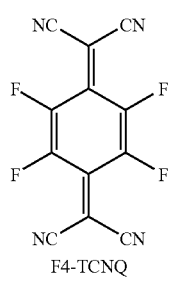

F4-TCNQ

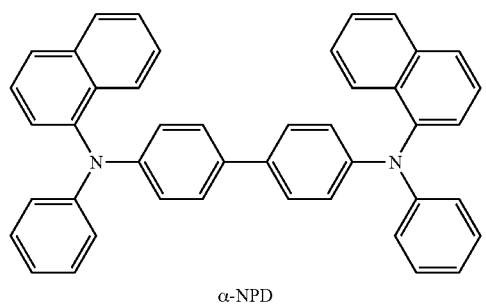

α-NPD

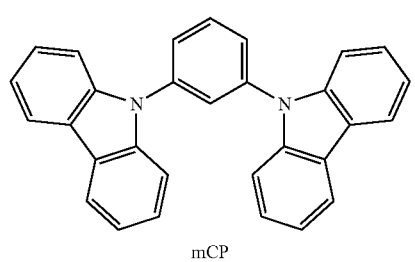

mCP

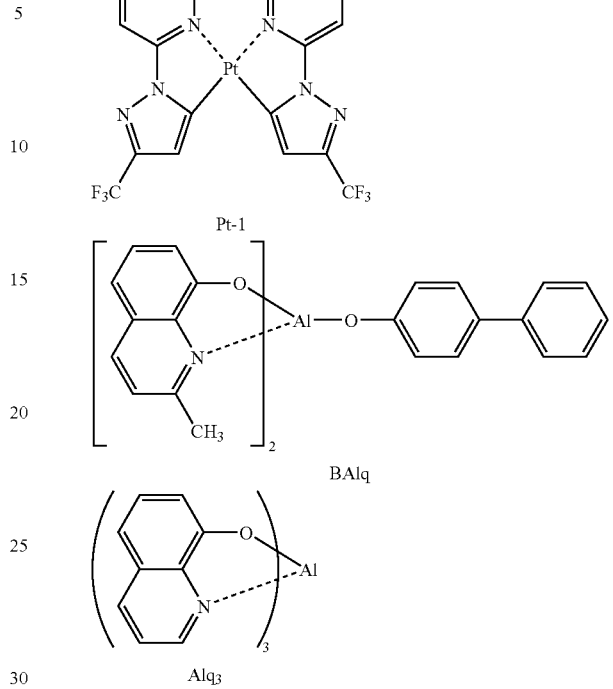

Pt-1

BAlq

Alq₃

(Driving Test)

The obtained organic EL element and the TFT element prepared in Example 1 were used in combination to constitute an equivalent circuit, and driving tests were performed under various conditions.

As a result, by using the TFT element of the invention, stable light emission was obtained even when the TFT was continuously driven for a long time.

Reference numerals used in Figures of the invention are explained below.
1: Substrate
2: Gate electrode
3: Gate insulating layer
4, 14, 24: Active layer
7, 17: Resistance layer
5-1: Source electrode
5-2: Drain electrode
6: Insulating layer
100: Driver TFT
200: Switching TFT
300: Organic EL element
400: Signal wire
500: Scanning wire
600: Capacitor
700: Common wire

What is claimed is:

1. A thin film field effect transistor comprising, on a substrate, at least a gate electrode, a gate insulating layer, an active layer containing an amorphous oxide semiconductor, a source electrode and a drain electrode, wherein
a resistance layer containing an amorphous oxide and having a thickness of more than 3 nm is disposed to cover an entire surface of the active layer at a side at which the source electrode and the drain electrode are provided, and is disposed between the active layer and at least one of the source electrode or the drain electrode, a band gap of the active layer is smaller than a band gap of the resistance layer, the active layer does not directly contact the drain electrode and the source electrode, and the band gap of the active layer is 2.0 eV or more and less than 4.0 eV, and wherein the resistance layer further covers the entire side surfaces of the active layer.

2. The thin film field effect transistor according to claim 1, wherein the band gap of the resistance layer is 4.0 eV or more and less than 15.0 eV.

3. The thin film field effect transistor according to claim 1, wherein a difference between the band gap of the active layer and the band gap of the resistance layer is 0.1 eV or more and less than 13.0 eV.

4. The thin film field effect transistor according to claim 1, wherein a carrier concentration of the active layer is higher than a carrier concentration of the resistance layer.

5. The thin film field effect transistor according to claim 1, wherein a film thickness of the resistance layer is from 5 nm to 80 nm.

6. The thin film field effect transistor according to claim 1, wherein the amorphous oxide semiconductor in the active layer includes at least one element selected from the group consisting of In, Sn, Zn, and Cd.

7. The thin film field effect transistor according to claim 1, wherein the amorphous oxide in the resistance layer includes at least one element selected from the group consisting of Ga, Mg, Al, Ca, and Si.

8. The thin film field effect transistor according to claim 1, wherein two layers comprising the active layer and the resistance layer are disposed between the gate insulating layer, and the source electrode or the drain electrode.

9. The thin film field effect transistor according to claim 1, wherein the active layer and the resistance layer are layers each formed by a sputtering method.

10. The thin film field effect transistor according to claim 1, wherein the substrate is a flexible substrate.

11. A display including a light-emitting element having a pair of electrodes and a light emission layer interposed between the electrodes, and a field effect transistor for driving the light-emitting element, wherein the field effect transistor is the thin film field effect transistor according to claim 1.

12. The thin film field effect transistor according to claim 7, wherein the amorphous oxide in the resistance layer includes at least $Ga_2O_3$.

13. The thin film field effect transistor according to claim 12, wherein the amorphous oxide semiconductor in the active layer includes at least In.

14. The thin film field effect transistor according to claim 13, wherein the amorphous oxide in the active layer is selected from the group consisting of IGZO and ITO.

15. The thin film field effect transistor according to claim 1, wherein the thin film filed effect transistor is a stagger structure.

16. The thin film field effect transistor according to claim 1, wherein the thin film filed effect transistor is a reversed stagger structure.

* * * * *